(12) United States Patent
Shi et al.

(10) Patent No.: US 11,948,505 B2
(45) Date of Patent: Apr. 2, 2024

(54) DISPLAY PANEL AND DISPLAY DEVICE WITH CONTROLLABLE WIDTH-TO-LENGTH RATIO OF CHANNEL REGION IN DIFFERENT SUBPIXELS

(71) Applicant: Wuhan Tianma Micro-Electronics Co., Ltd., Wuhan (CN)

(72) Inventors: Jiao Shi, Wuhan (CN); Di Zhang, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 60 days.

(21) Appl. No.: 17/687,594

(22) Filed: Mar. 4, 2022

(65) Prior Publication Data
US 2023/0215350 A1 Jul. 6, 2023

(30) Foreign Application Priority Data
Dec. 31, 2021 (CN) .......................... 202111667359.0

(51) Int. Cl.
*G09G 3/32* (2016.01)
*G09G 3/3225* (2016.01)
(Continued)

(52) U.S. Cl.
CPC ....... *G09G 3/3225* (2013.01); *H10K 59/1213* (2023.02); *G09G 2300/0452* (2013.01);
(Continued)

(58) Field of Classification Search
CPC ......... G09G 3/3225; G09G 2300/0452; G09G 2300/0842; G09G 2320/0214; G09G 2320/0233; G09G 3/2003; G09G 2300/0426; G09G 2300/0814; G09G 2300/0819; G09G 2300/0866; G09G 2320/045; G09G 3/3233; G09G 3/32; H10K 59/1213; H01L 29/78696

See application file for complete search history.

(56) References Cited

U.S. PATENT DOCUMENTS

2020/0193932 A1* 6/2020 Liu .................... H01L 29/41733
2022/0068225 A1* 3/2022 Min ..................... H10K 59/353
(Continued)

FOREIGN PATENT DOCUMENTS

CN 112542126 A 3/2021

*Primary Examiner* — Pegeman Karimi
(74) *Attorney, Agent, or Firm* — Anova Law Group, PLLC

(57) ABSTRACT

Display panel and display device are provided. The display panel includes a plurality of subpixels. A subpixel of the plurality of subpixels includes a pixel circuit and a light emitting element that are electrically connected. The pixel circuit includes a first transistor. A first electrode of the first transistor is connected to a first reference voltage signal terminal. A second electrode of the first transistor is electrically connected to an anode of the light emitting element. In a light emitting retention stage of the subpixel of the plurality of subpixels, the first reference voltage signal terminal is connected to a negative potential signal or a ground potential signal. The plurality of subpixels includes at least a first subpixel and a second subpixel, and a color of the first subpixel is different from a color of the second subpixel.

21 Claims, 22 Drawing Sheets

(51) Int. Cl.
*H10K 59/121* (2023.01)
*H01L 29/786* (2006.01)

(52) U.S. Cl.
CPC .............. *G09G 2300/0842* (2013.01); *G09G 2320/0214* (2013.01); *G09G 2320/0233* (2013.01); *H01L 29/78696* (2013.01)

(56) References Cited

U.S. PATENT DOCUMENTS

2022/0122512 A1\* 4/2022 Lee .................... G09G 3/3233
2022/0215799 A1\* 7/2022 Wang .................. H10K 59/131

\* cited by examiner

DISPLAY PANEL AND DISPLAY DEVICE WITH CONTROLLABLE WIDTH-TO-LENGTH RATIO OF CHANNEL REGION IN DIFFERENT SUBPIXELS

CROSS-REFERENCE TO RELATED APPLICATION

This application claims priority of Chinese Patent Application No. 202111667359.0, filed on Dec. 31, 2021, the entire contents of which are hereby incorporated by reference.

FIELD OF THE DISCLOSURE

The present disclosure generally relates to the field of display technology and, more particularly, relates to a display panel and a display device.

BACKGROUND

An organic light emitting diode (OLED) display device is an active light emitting display device, which has advantages of simple formation process, low cost, high contrast ratio, wide viewing angle, and low power consumption. OLED display technology has been widely used in digital products and is one of main technologies in new display technologies. The OLED display technology is different from a traditional liquid crystal display (LCD) in display mode. the OLED display technology does not require a backlight and uses a very thin organic material coating and a glass substrate. The organic material emits light when an electric current is passed through the organic material. The OLED display technology mainly controls a magnitude of an output current to display different brightness through a thin film transistor (TFT).

In a full-color OLED display field, a high luminous efficiency of a R/G/B luminescent material is extremely important. At present, due to natures of materials, luminous efficiencies and lifespans of luminescent materials of different colors vary greatly, which easily leads to color shift problems in low-grayscale images when an environment such as ambient temperature, humidity or electric field changes. In addition, subpixels of an OLED are usually evaporated in an array arrangement. Due to an influence of an evaporation process and characteristics of a luminescent material, start-up voltages of red subpixels, blue subpixels and green subpixels are different, which leads to a phenomenon that some subpixels are prone to steal light, thereby greatly reducing a display effect.

Therefore, it is a technical problem to be solved urgently by a person skilled in the art to provide a display panel and a display device that can improve a display effect without affecting a circuit structure and an overall performance of the display panel.

BRIEF SUMMARY OF THE DISCLOSURE

One aspect of the present disclosure provides a display panel. The display panel includes a plurality of subpixels. A subpixel of the plurality of subpixels includes a pixel circuit and a light emitting element that are electrically connected. The pixel circuit includes a first transistor. A first electrode of the first transistor is connected to a first reference voltage signal terminal. A second electrode of the first transistor is electrically connected to an anode of the light emitting element. In a light emitting retention stage of the subpixel of the plurality of subpixels, the first reference voltage signal terminal is connected to a negative potential signal or a ground potential signal. The plurality of subpixels includes at least a first subpixel and a second subpixel, and a color of the first subpixel is different from a color of the second subpixel. A width-to-length ratio of a channel region of the first transistor in the first subpixel is N1, a width-to-length ratio of a channel region of the first transistor in the second subpixel is N2, and Another aspect of the present disclosure provides a display device. The display device includes a display panel. The display panel includes a plurality of subpixels. A subpixel of the plurality of subpixels includes a pixel circuit and a light emitting element that are electrically connected. The pixel circuit includes a first transistor. A first electrode of the first transistor is connected to a first reference voltage signal terminal. A second electrode of the first transistor is electrically connected to an anode of the light emitting element. In a light emitting retention stage of the subpixel of the plurality of subpixels, the first reference voltage signal terminal is connected to a negative potential signal or a ground potential signal. The plurality of subpixels includes at least a first subpixel and a second subpixel, and a color of the first subpixel is different from a color of the second subpixel. A width-to-length ratio of a channel region of the first transistor in the first subpixel is N1, a width-to-length ratio of a channel region of the first transistor in the second subpixel is N2, and N1>N2.

Other aspects of the present disclosure can be understood by a person skilled in the art in light of the description, the claims, and the drawings of the present disclosure.

BRIEF DESCRIPTION OF THE DRAWINGS

Accompanying drawings, which are incorporated in and constitute a part of the present specification, illustrate embodiments of the present disclosure, and explain principles of the present disclosure together with the present specification.

DETAILED DESCRIPTION

Various exemplary embodiments of the present disclosure will be described in detail with reference to the accompanying drawings. Unless specifically stated otherwise, a relative arrangement of components and steps, numerical expressions and numerical values set forth in the embodiments do not limit the scope of the present disclosure.

The following description of at least one exemplary embodiment is merely illustrative and is not intended to limit the present disclosure and applications thereof.

Techniques, methods, and devices known to a person skilled in the art may not be discussed in detail, but where appropriate, such techniques, methods, and devices should be considered part of the specification.

In all examples shown and discussed herein, any specific value should be construed as illustrative only and not as limiting. Accordingly, other examples of exemplary embodiments may have different values.

Similar numerals and letters refer to similar items in the accompanying drawings. Therefore, once an item is defined in an accompanying drawing, further discussions about the item are not required in subsequent accompanying drawings.

Figure 1:
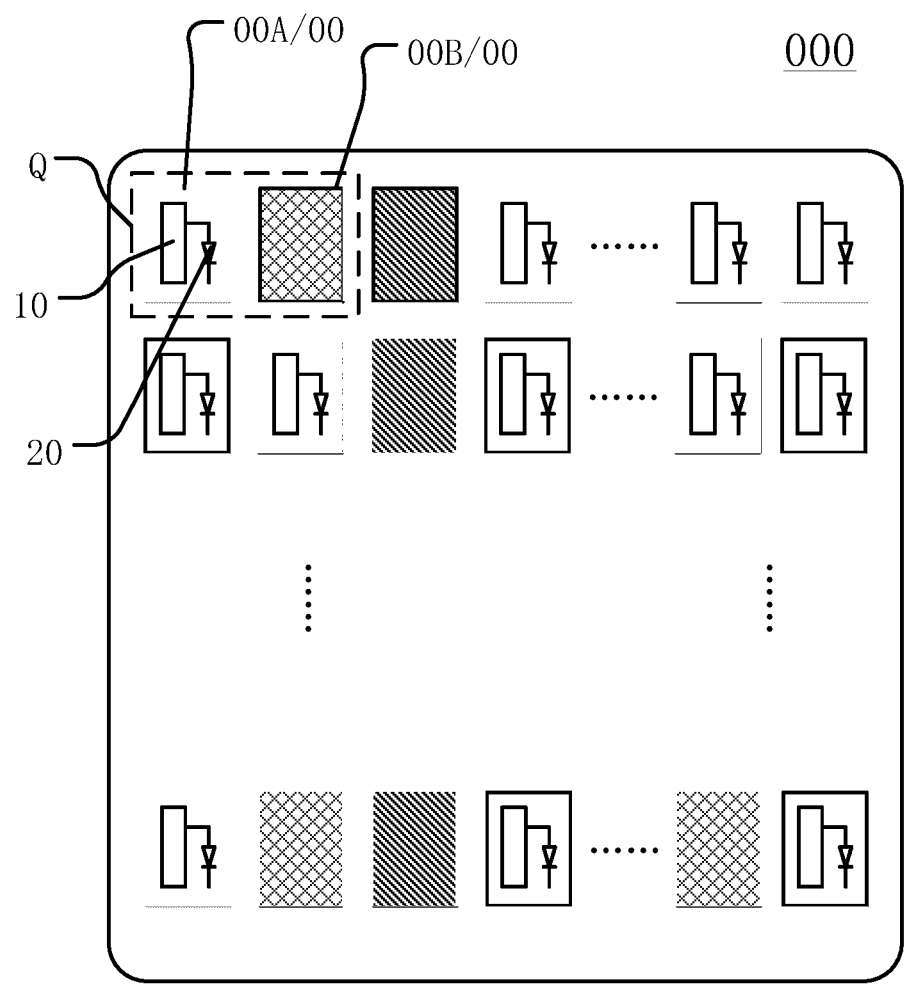
FIG. 1 illustrates a planar structure diagram of a display panel consistent with various embodiments of the present disclosure.
Figure 2:
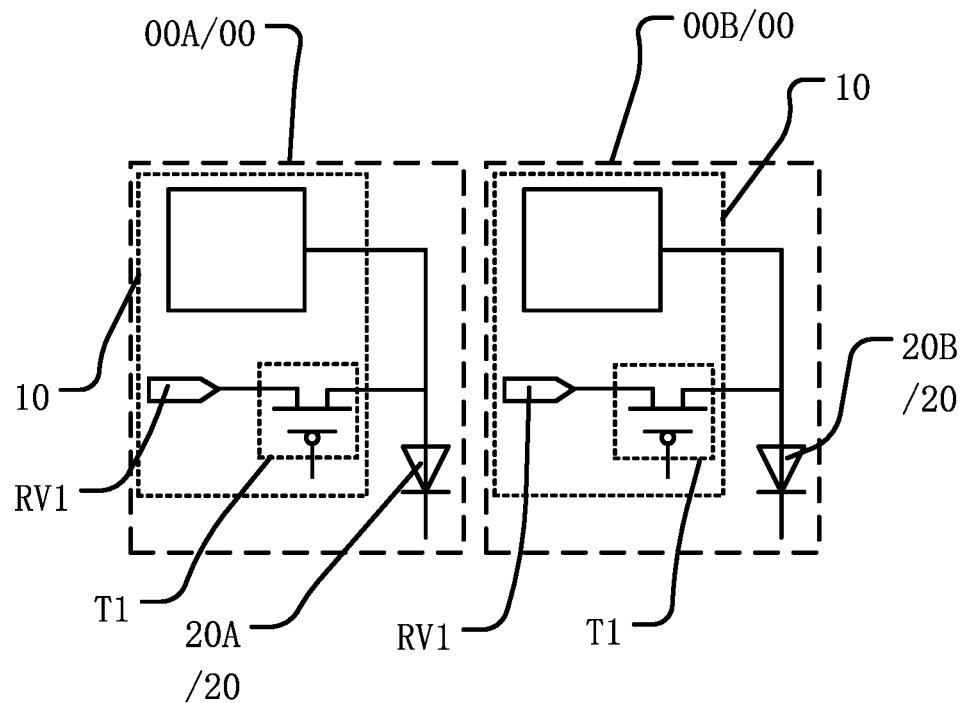
FIG. 2 illustrates a connection structure diagram of a pixel circuit and a light emitting element in a subpixel in a Q region in FIG. 1.

Referring to FIG. 1 and FIG. 2, FIG. 1 illustrates a planar structure diagram of a display panel consistent with various embodiments of the present disclosure, and FIG. 2 illustrates a connection structure diagram of a pixel circuit and a light emitting element in a subpixel of a Q region in FIG. 1. FIG. 1 is filled with transparency to clear illustrate a structure of the display panel in one embodiment. The display panel 000 includes a plurality of subpixels 00. A subpixel of the plurality of subpixels 00 includes a pixel circuit 10 and a light emitting element 20 that are electrically connected. The pixel circuit 10 includes a first transistor T1. A first electrode of the first transistor T1 is connected to a first reference voltage signal terminal RV1. A second electrode of the first transistor T1 is electrically connected to an anode of the light emitting element 20. In a light emitting retention stage of the subpixel 00, the first reference voltage signal terminal RV1 is connected to a negative potential signal or a ground potential signal. The plurality of subpixels 00 includes at least a first subpixel 00A and a second subpixel 00B, and a color of the first subpixel 00A is different from a color of the second subpixel 00B.

A width-to-length ratio of a channel region of the first transistor T1 in the first subpixel 00A is N1, a width-to-length ratio of a channel region of the first transistor T1 in the second subpixel 00B is N2, and N1>N2.

Specifically, the display panel 000 may be an OLED display panel. The display panel 000 may include a plurality of subpixels 00. Optionally, the plurality of subpixels 00 may include subpixels of different colors represented by different filling patterns in FIG. 1. For example, the plurality of subpixels 00 may include at least red subpixels, green subpixels, blue subpixels, and white subpixels. The plurality of subpixels 00 may be arranged in an array on the display panel 000 or may also be arranged in another manner. FIG. 1 only takes the array arrangement of the plurality of subpixels 00 as an example for illustration. In FIG. 1, an orthographic projection shape of the subpixel 00 to a light emitting surface of the display panel 000 is taken as a stripe as an example for illustration. During specific implementation, the orthographic projection shape of the subpixel 00 includes but is not limited to a stripe shape, which can be designed according to actual needs.

As shown in FIG. 2, in one embodiment, the subpixel 00 includes a pixel circuit 10 and a light emitting element 20 that are electrically connected. Optionally, the light emitting element 20 may be an organic light emitting diode. The pixel circuit 10 is configured to transmit a light emitting drive current to the light emitting element 20 under an action of a signal of a drive signal line such as a scan line, a data line, a voltage signal line (not shown) on the display panel 000, to provide the drive current for the light emitting element 20 to emit light.

In one embodiment, the pixel circuit 10 includes a first transistor T1. In FIG. 2, structures of the pixel circuit 10 other than the first transistor T1 are only shown in a block diagram. Other specific structures in the pixel circuit 10 are not limited herein. During specific implementation, the pixel circuit 10 includes, but is not limited to, the structures in the embodiment. The pixel circuit 10 may also include other structures capable of realizing the light emitting element 20 to emit light, such as a reset module, a data signal writing module, which are not repeated herein, and can be understood with reference to a structures of the pixel circuit 10 in the art.

The pixel circuit 10 includes a first transistor T1. A first electrode of the first transistor T1 is connected to the first reference voltage signal terminal RV1, and the second electrode of the first transistor T1 is connected to the anode of the light emitting element 20. Optionally, the first reference voltage signal terminal RV1 may be connected to a first reference voltage signal line (not shown) in the display panel 000, so that in the light emitting retention stage of the subpixel 00, a negative potential signal or a ground potential signal is connected to the first reference voltage signal terminal RV1 through the first reference voltage signal line. The light emitting retention stage of the subpixel 00 herein can be understood as a stage in which the light emitting element 20 in the subpixel 00 is in a light emitting state and lasts for a period, which is a stage of the light emitting state. Optionally, the first transistor T1 is in an off state. In some optional embodiments, when the pixel circuit 10 drives the subpixel 00 to emit light, a working period of the subpixel may include a plurality of light emitting retention stages. The plurality of subpixels 00 includes at least a first subpixel 00A and a second subpixel 00B. A color of the first subpixel 00A is different from a color of the second subpixel 00B. That is, a light emitting element 20A in the first subpixel 00A and a light emitting element 20B in the second subpixel 00B have different luminescent materials and can emit light of different colors under a driving of the pixel circuit 10. Whether a signal connected to the first reference voltage signal terminal RV1 is a negative potential signal or a ground potential signal is not specially limited herein, and a specific value of the negative potential signal is not specially limited herein, as long as the first transistor T1 can transmit the negative potential signal or the ground potential signal to the anode of the light emitting element 20 when the first transistor T1 is in an on state. The first transistor T1 can be understood as a transistor for pulling down a anode potential of the light emitting element 20 and resetting the anode potential.

In the art, size designs of transistors that play a same role in each subpixel on the display panel are generally same and not differentiated. However, due to different luminescent materials of light emitting elements of different colors in subpixels, luminous efficiencies of the light emitting elements of different colors are also different, so that performances of the light emitting elements of different colors are inconsistent at a low grayscale. For example, when an environment such as ambient temperature, humidity, or electric field changes, a performance of a light emitting element at a low grayscale is mainly affected by an anode charging of the light emitting element. That is, a light emission of the light emitting element at a low grayscale is mainly affected by a current of the first transistor connected to an anode of the light emitting element. At a low grayscale, a current change of the first transistor is in a stage when the luminous efficiency of the light emitting element gradually increases. Increasing trends of luminous efficiencies of the light emitting elements of different colors are different. That is, the luminous efficiencies of the light emitting elements of different colors are different, which easily leads to a difference in chromaticity when the display panel is displayed at a low grayscale. The higher a refresh, the bigger the difference in chromaticity.

Figure 3:
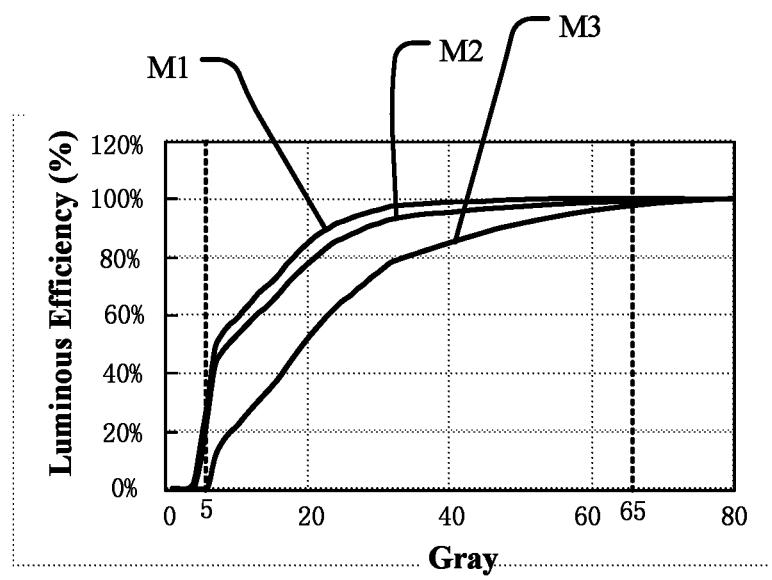
FIG. 3 illustrates an luminous efficiency curve corresponding to light emitting elements of different colors at different low grayscales.

Specifically, as shown in FIG. 3, FIG. 3 illustrates a diagram showing a corresponding luminous efficiency curve of light emitting elements of different colors at different low grayscales. An abscissa is a grayscale value, and an ordinate is a luminous efficiency of a light emitting element. Optionally, luminous efficiencies of red and green light materials have met commercial needs, while a development of luminous efficiencies and lifespans of blue light materials is relatively backward. In FIG. 3, a curve M1 represents a red light emitting element, a curve M2 represents a green light emitting element, and a curve M3 represents a blue light emitting element. As can be seen from FIG. 3, at a low grayscale within a certain range, luminous efficiencies of the red light emitting element and the green light emitting element are both greater than a luminous efficiency of the blue light emitting element, and a luminous efficiency of the red light emitting element is greater than a luminous efficiency of the green light emitting element. Because the luminous efficiencies of the red light emitting element and the green light emitting element have a relatively great increase within the grayscale range, when the display panel is at a low grayscale, a current of the light emitting element with higher efficiency is usually small. When an ambient temperature changes, a slight current change has a relatively great impact on a brightness of the red light emitting element and a brightness of the green light emitting element at a low grayscale, which may easily lead to relatively large brightness fluctuations of the red light emitting element and the green light emitting element. However, the luminous efficiency of the blue light emitting element has a relatively small increase in the grayscale range, and a current of the blue light emitting element is large. which may easily lead to a relatively small brightness fluctuation of the blue light emitting element when an ambient temperature changes. Therefore, a current increase of the red light emitting element and the green light emitting element is larger than a current increase of the blue light emitting element, so that a brightness increase of the red light emitting element and the green light emitting element is higher than a brightness increase of the blue light emitting element. Eventually, when an ambient temperature increases, the red light emitting element and the green light emitting element are likely to emit blue-yellow light, resulting in a color shift at a low grayscale.

FIG. 3 only takes one material system as an example to explain a relationship between luminous efficiencies and grayscales of light emitting elements of different colors made from the one material system. In some display panels made by other material systems, a corresponding relationship between the curve M1, the curve M2, the curve M3 and a color may also include other corresponding relationships, which is not limited by FIG. 3.

Since a color of the first subpixel 00A is different from a color of the second subpixel 00B, that is, a luminescent material of the light emitting element 20A in the first subpixel 00A is different from a luminescent material the light emitting element 20B in the second subpixel 00B. Therefore, a light emitting performance of the light emitting element 20A in the first subpixel 00A and a light emitting performance of the light emitting element 20B in the second subpixel 00B may also be different. For example, due to different luminescent materials of the light emitting element 20A in the first subpixel 00A and the light emitting element 20B in the second subpixel 00B, a turn-on voltage VA of the light emitting element 20A in the first subpixel 00A may be lower than a turn-on voltage VB of the light emitting element 20B in the subpixel 00B. Therefore, when the light emitting element 20B in the second subpixel 00B emits light and an anode voltage of the light emitting element 20B reaches the turn-on voltage VB, the light emitting element 20B emits light and carriers migrate laterally (i.e., in a direction parallel to a light emitting surface of the display panel 000) to subpixels of other colors adjacent to the second sub-pixel 00B through a common film layer in the light emitting element 20 in the display panel. When the light emitting element 20 is an organic light emitting diode, the light emitting element 20 may include an anode, a hole transport layer, a light emitting layer, an electron transport layer and a cathode that are stacked in sequence. Anodes in different light emitting elements 20 are arranged independently of each other. Light emitting layers in different light emitting elements 20 are also arranged independently of each other due to different materials and are not connected to each other. The hole transport layer, the electron transport layer and the cathode are generally arranged in a whole layer. That is, hole transport layers in different light emitting elements 20 are interconnected, electron transport layers in different light emitting elements 20 are also interconnected, and cathodes in different light emitting elements 20 are also interconnected. Therefore, the cathode layer, the hole transport layer, and the electron transport layer may be referred to as common layers of the light emitting elements 20. For example, when the light emitting element 20B in the second sub-pixel 00B is turned on, carriers easily migrate to the light emitting element 20A in the adjacent first subpixel 00A. Since the turn-on voltage VA of the light emitting element 20A in the first subpixel 00A is lower than the turn-on voltage VB of the light emitting element 20B in the second subpixel 00B, that is, the turn-on voltage VA of the light emitting element 20A in the first subpixel 00A is relatively low, fewer carriers migrated over are likely to cause the light emitting element 20A in the first subpixel 00A to emit weak light. When the light emitting element 20B in the second subpixel 00B emits light, a problem that the light emitting element 20A in the first subpixel 00A steals light affects a display effect.

To solve the above problem, in one embodiment, the width-to-length ratio N1 of the channel region of the first transistor T1 in the first subpixel 00A is set to be larger than the width-to-length ratio N2 of the channel region of the first transistor T1 in the second subpixel 00B, so that a leakage current of the first transistor T1 in the first subpixel 00A is larger than a leakage current of the first transistor T1 in the second subpixel 00B. A leakage current of a transistor refers to a source-drain current at a certain source-drain voltage when a gate voltage of the transistor is a cut-off voltage of the transistor. Therefore, when the light emitting element 20A in the first subpixel 00A emits light at a low grayscale, compared with the second subpixel 00B, a relatively large current leaks from the first transistor T1 in the first subpixel 00A, so that the luminous efficiency of the light emitting element 20A in the first subpixel 00A decreases, which is conducive to enhancing a brightness stability of the light emitting element 20A in the first subpixel 00A. If the luminous efficiency of the light emitting element 20A in the first subpixel 00A is greater than the light emitting efficiency of the light emitting element 20B in the second subpixel 00B, after setting the width-to-length ratio N1 of the channel region of the first transistor T1 in the first subpixel 00A to be greater than the width-to-length ratio N2 of the channel region of the first transistor T1 in the second subpixel 00B, the luminous efficiency of the light emitting element 20A in the subpixel 00A decreases and is consistent or substantially consistent with the luminous efficiency of the light emitting element 20B in the second subpixel 00B as far as possible. That is, a brightness fluctuation of the light emitting element 20A in the first subpixel 00A with a change of the ambient temperature decreases, so that a brightness increase of the light emitting element 20A in the first subpixel 00A decreases and achieves a same brightness increase as the light emitting element 20B in the second subpixel 00B as far as possible. Eventually, brightness fluctuations of the light emitting elements 20 of different colors under environmental changes are as balanced as possible, so that the light emitting elements 20 of different colors emit light normally at a low grayscale, color shifts are avoided, and white images at a low grayscale are displayed normally, which is conducive to improving a display effect of the display panel 000 at a low grayscale.

A width-to-length ratio of the channel region of the first transistor T1 in the first subpixel 00A with a small turn-on voltage is set to be N1, a width-to-length ratio of the channel region of the first transistor T1 in the second subpixel 00B with the large turn-on voltage is set to be N2, and N1>N2. That is, the width-to-length ratio N1 of the channel region of the first transistor T1 in the first subpixel 00A with the small turn-on voltage is greater than the width-to-length ratio N2 of the channel region of the first transistor T1 in the second subpixel 00B with the large turn-on voltage. Since the greater a width-to-length ratio of the channel region of a transistor, the greater a leakage current of the transistor, the width-to-length ratio of the channel region of the first transistor T1 in the first subpixel 00A with a small turn-on voltage is set to be large. That is, a leakage performance of the first transistor T1 in the first subpixel 00A is relatively strong. After the light emitting element 20B in the second subpixel 00B is turned on, when a brightness of the light emitting element 20B in the second subpixel 00B is strong, and carriers migrate to the light emitting element 20A in the first subpixel 00A, through a strong leakage current performance of the first transistor T1 in the first subpixel 00A, a leakage current can be diverted in a state where the first transistor T1 in the first subpixel 00A is turned off, so as to prevent the light emitting element 20A in the first subpixel 00A from stealing light when the first subpixel 00A does not need to emit light, which is conducive to improving a display effect.

In the display panel 000, width-length ratios of channel regions of first transistors T1 connected to the light emitting elements 20 of different colors are set to be different, to balance display effects of subpixels of different colors, and avoid a situation that subpixels of some colors steal light when subpixels of other colors emit light, and also avoid color shifts of the light emitting elements 20 of different colors at a low grayscale, thereby improving a display effect of the display panel 000 at a low grayscale without affecting a circuit structure and an overall performance of the display panel.

In the display panel 000, only by adjusting width-to-length ratios of channel regions of the first transistors T1 connected to the light emitting elements 20 of different colors to be different, overall sizes of the first transistors T1 connected to the light emitting elements 20 of different colors can be different. It is not necessary to make an overall size of the first transistor T1 connected to the light emitting element 20 of one color smaller or larger, so that overall sizes of the first transistors T1 connected to the light emitting elements 20 of different colors are different. In one embodiment, less changes are made to an overall structure of the pixel circuit 10, that is, it is only necessary to adjust an off-state leakage current of the first transistor T1 at an anode port of the light emitting element 20 to achieve a purpose of adjusting a color shift at a low grayscale without changing other structures of the first transistor T1 and has little impact on other performances of the first transistor T1. A length value or width value of the channel region of a first transistor has a certain influence on different characteristics of the first transistor. When length values or width values of the channel regions of the first transistors T1 in the display panel are required, it is only necessary to adjust corresponding width values or length value of the channel regions of the first transistors T1 to improve a display effect of the display panel at a low grayscale. When the display effect is guaranteed, an influence of adjusting the width values or length values of the channel regions of the first transistors T1 on a spatial arrangement of the display panel is small.

Figure 4:
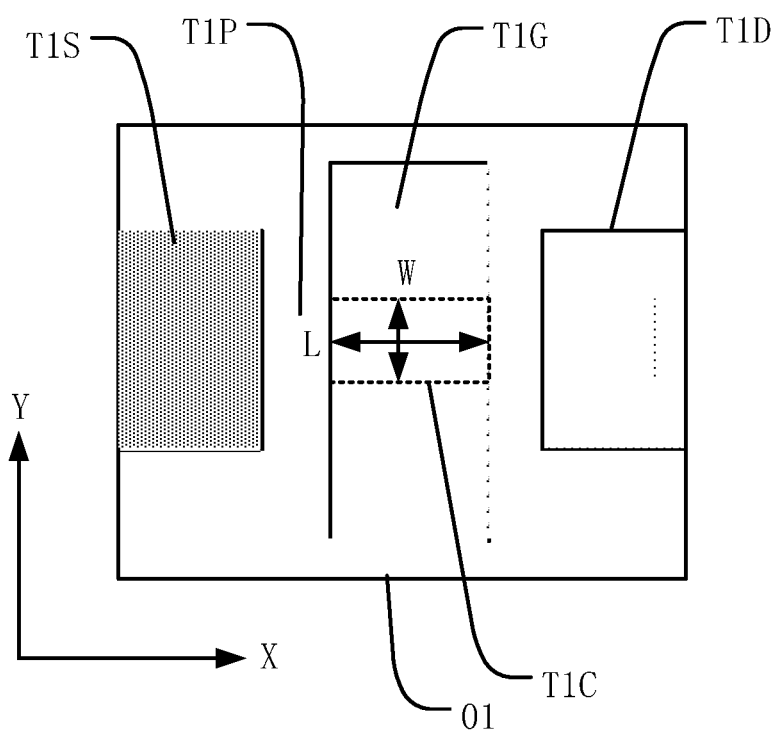
FIG. 4 illustrates a film layer structure diagram of a first transistor in a display panel consistent with various embodiments of the present disclosure.

Referring to FIG. 1, FIG. 2 and FIG. 4, FIG. 4 illustrates a film layer structure diagram of a first transistor in a display panel consistent with various embodiments of the present disclosure. In one embodiment, FIG. 4 is filled with transparency to clearly illustrate a structure of the first transistor. The display panel 000 may include a substrate 01 which is not filled with transparency in FIG. 4. The light emitting element 20 and the pixel circuit 10 are both disposed on the substrate 01. The first transistor T1 includes a first gate T1G, a first source T1S, a first drain T1D and a first active part T1P. In a direction perpendicular to the plane of the substrate 01, a region where the first gate T1G overlaps the first active part T1P is a channel region T1C of the first transistor T1. The embodiment does not specifically limit a width and a length of the channel region of the first transistor T1 in the first subpixel 00A and a width and a length of the channel region of the first transistor T1 in the second subpixel 00B, as long as the width-to-length ratio N1 of the channel region of the first transistor T1 in the first subpixel 00A of different colors is different from the width-to-length ratio N2 of the channel region of the first transistor T1 in the second subpixel 00B.

Optionally, referring to FIG. 1 and FIG. 4, in one embodiment, the first transistor T1 further includes a first gate T1G, a first source T1S, and a first drain T1D. Along a first direction X, a length of the channel region T1C of the first transistor T1 is L. Along a second direction Y, a width of the channel region T1C of the first transistor T1 is W, A width-to-length ratio of the channel region T1C of the first transistor T1 is W/L. In a direction parallel to a light emitting surface of the display panel 000, a direction of the first source electrode T1S pointing to the first drain electrode T1D is the first direction X, and the second direction Y intersects the first direction X. Optionally, in FIG. 4, the first direction X and the second direction Y being perpendicular to each other in a direction parallel to a light emitting surface of the display panel 000 is taken as an example for illustration.

Optionally, in one embodiment, the first transistor T1 may be a P-type transistor, the first transistor T1 includes a first active part T1P, and the first active part T1P includes a silicon semiconductor. The first transistor T1 may be a P-type transistor of a semiconductor silicon. Compared with an indium gallium zinc oxide (IGZO) transistor and a N-type transistor, the IGZO and N-type transistors have a better anti-leakage performance than the P-type transistor of a semiconductor silicon. Therefore, for the first transistor T1 with a slightly worse anti-leakage current performance, by setting width-length ratios of the channel regions of the first transistors T1 corresponding to the light emitting elements 20 of different colors to be different, an effect of improving color shifts can be better achieved by changing leakage currents of the light emitting elements 20.

In the display panel 000 at a high grayscale, which is in a light emitting state of the light emitting elements 20, although a leakage current of the first transistor T1 of the first subpixel 00A is larger than a leakage current of the first transistor T1 of the second subpixel 00B, a magnitude of a light emitting current of the light emitting element 20 is much larger than a magnitude of the leakage current of the light emitting element 20 at a high grayscale. Therefore, in the embodiment, width-length ratios of the channel regions of the first transistors T1 connected to the light emitting elements 20 of different colors are set to be different, and an influence of the width-length ratios of the channel regions of the first transistors T1 on a light emitting current at a high grayscale can be ignored.

A structure of the display panel 000 includes but is not limited to the above structures. During specific implementation, the display panel 000 may further include other structures capable of realizing a display function, which are not repeated herein, and can be understood with reference to a structure of an organic light emitting diode display panel in the art.

Optionally, in one embodiment, referring to FIGS. 1-4, at a first grayscale, the luminous efficiency of the light emitting element 20A in the first subpixel 00A is greater than the luminous efficiency of the light emitting element 20B in the second subpixel 00B. A grayscale value of the first grayscale is Gray, and 5≤Gray≤65. As can be seen from FIG. 3, the light emitting element 20A in the first subpixel 00A may be either a red light emitting element or a green light emitting element, the light emitting element 20B in the second subpixel 00B may be a blue light emitting element, at the first grayscale, the luminous efficiency of the light emitting element 20A in the first subpixel 00A is greater than the luminous efficiency of the light emitting element 20B in the second subpixel 00B. Alternatively, the light emitting element 20A in the first subpixel 00A is a red light emitting element, the light emitting element 20B in the second subpixel 00B is a green light emitting element, and at the first grayscale, the luminous efficiency of the light emitting element 20A in the first subpixel 00A is greater than the luminous efficiency of the light emitting element 20B in the second subpixel 00B.

The embodiment explains that in the luminous efficiencies corresponding to light emitting elements of different colors, as shown in FIG. 3, at a low grayscale in a first grayscale range, luminous efficiencies of the three light emitting elements 20 with different colors are quite different. Outside the first grayscale range, the luminous efficiencies of the three light emitting elements 20 with different colors basically tend to be same. Therefore, a color shift at a low grayscale solved in the embodiment means that at the first grayscale, in at least two subpixels 00 of different colors, the luminous efficiency of the light emitting element 20A in the first subpixel 00A is greater than the luminous efficiency of the light emitting element 20B in the second subpixel 00B. The grayscale value of the first grayscale is Gray, and 5≤Gray≤65. As shown in FIG. 3, when the grayscale value Gray of the first grayscale is greater than or equal to 5 and less than or equal to 65, the luminous efficiency of the red light emitting element indicated by the curve M1 is greater than the luminous efficiency of the green light emitting element indicated by the curve M2. The luminous efficiency of the green light emitting element indicated by the curve M2 is greater than that of the blue light emitting element indicated by the curve M3. When the grayscale value Gray of the first grayscale is less than 5, the luminous efficiencies of the three light emitting elements 20 of different colors are all close to 0. When the grayscale value Gray of the first grayscale is greater than 65, the luminous efficiencies of the three light emitting elements 20 of different colors are basically about 100. Therefore, when the width-to-length ratio N1 of the channel region of the first transistor T1 in the first subpixel 00A with an original high luminous efficiency is set to be larger than the width-to-length ratio N2 of the channel region of the first transistor T1 in the second subpixel 00B with an original low luminous efficiency, the leakage current of the first transistor T1 in the first subpixel 00A is larger than the leakage current of the first transistor T1 in the second subpixel 00B, so that when the light emitting element 20A in the first subpixel 00A emits light at the first grayscale, compared with the second subpixel 00B, a relatively large current leaks from the first transistor T1 in the first subpixel 00A. Therefore, the luminous efficiency of the light emitting element 20A in the first subpixel 00A decreases to be consistent or substantially consistent with the luminous efficiency of the light emitting element 20B in the second subpixel 00B as far as possible, thereby enhancing a brightness stability of the display panel. That is, when the luminous efficiency of the light emitting element 20A in the first subpixel 00A with an original high luminous efficiency decreases, a brightness fluctuation of the light emitting element 20A with a change of the ambient temperature decreases, so that a brightness increase of the light emitting element 20A in the first subpixel 00A decreases and achieves a same brightness increase as the light emitting element 20B in the second subpixel 00B as far as possible. Brightness fluctuations of the light emitting elements 20 of different colors under an environment change are as balanced as possible, thereby avoiding color shifts and improving a display effect of the display panel at the first grayscale.

Figure 5:
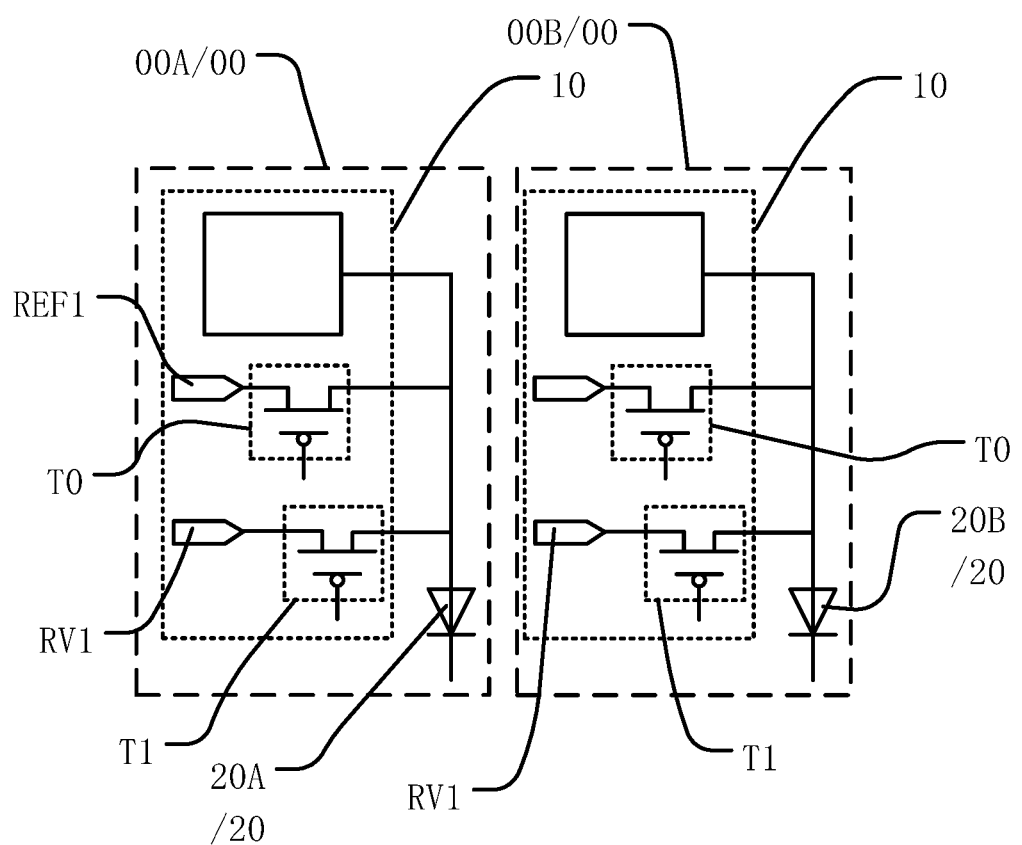
FIG. 5 illustrates another connection structure diagram of a pixel circuit and a light emitting element in a subpixel in the Q region in FIG. 1.

In some optional embodiments, referring to FIG. 1 and FIG. 5, FIG. 5 illustrates another connection structure diagram of a pixel circuit and a light emitting element in a subpixel of the Q region in FIG. 1. In one embodiment, the pixel circuit 10 further includes a reset transistor T0. A first electrode of the reset transistor T0 is connected to the anode of the light emitting element 20, and a second electrode of the reset transistor T0 is connected to a reset signal terminal REEF.

The embodiment explains that the first transistor T1 can be used as a drain transistor. That is, the first transistor T1 is electrically connected to the anode of the light emitting element 20, and the width-length ratio of the channel region of the first transistor T1 of the first subpixel 00A with a low turn-on voltage and a high luminous efficiency is designed to be relatively large, so as to increase the leakage current of the first transistor T1 and solve a problem of subpixel stealing light and a color shift of the display panel at a low grayscale. The pixel circuit 10 in the display panel 000 may further include a reset transistor T0. That is, the first transistor T1 and a transistor for resetting the anode of the light emitting element 20 may be two different transistors. The first electrode of the reset transistor T0 is connected to the anode of the light emitting element 20, and the second electrode of the reset transistor T0 is connected to the reset signal terminal REF1. The anode of the light emitting element 20 can be reset by a reset signal provided by the reset signal terminal REF1 in an initialization stage of the pixel circuit 10, so that the anode of the light emitting element 20 is initialized, thereby improving a residual of a display signal of a previous frame during a display process and improving an afterimage phenomenon and a display effect.

In the embodiment, the pixel circuit 10 includes, but is not limited to, a structure shown in FIG. 5. During specific implementation, the pixel circuit 10 may also include other electrically connected module structures (represented by a block diagram in FIG. 5) for realizing the light emitting element 20 to emit light, which is not limited herein and can be understood with reference to a circuit structure of a pixel circuit in a related art.

Figure 6:
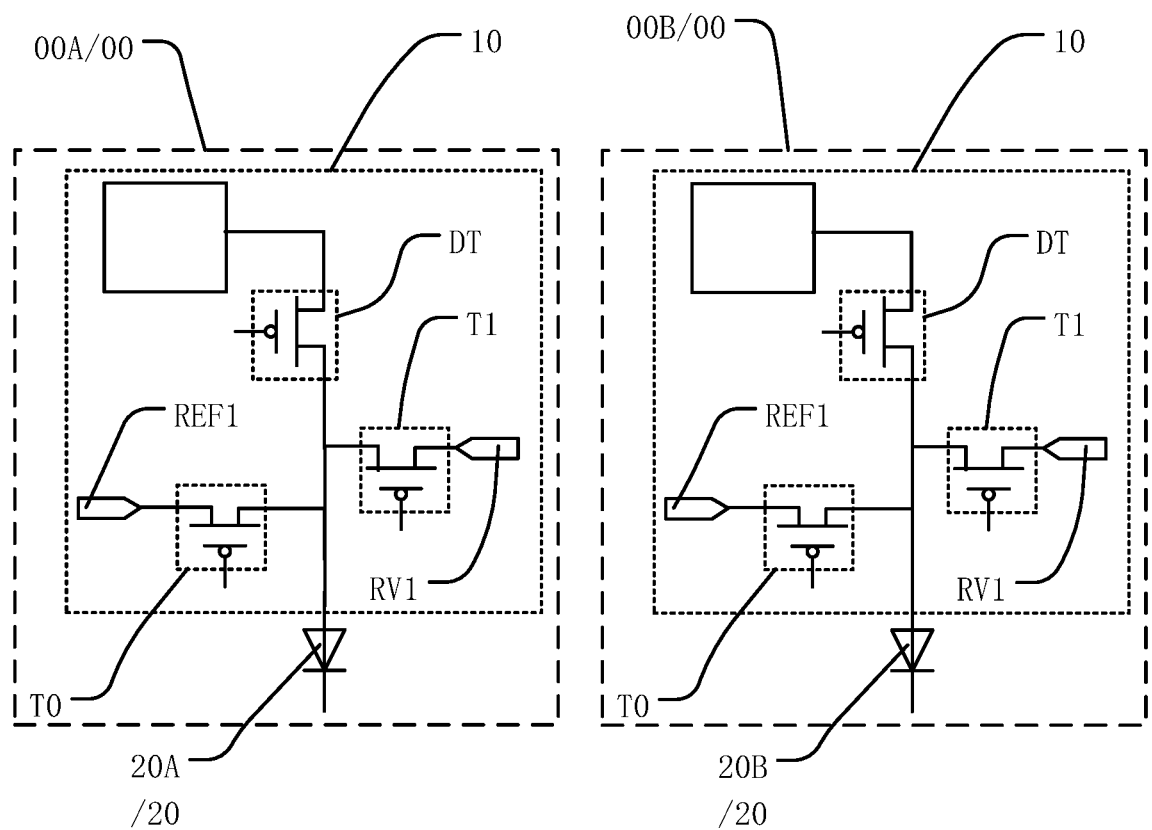
FIG. 6 illustrates another connection structure diagram of a pixel circuit and a light emitting element in a subpixel in the Q region in FIG. 1.

Optionally, as shown in FIG. 6, FIG. 6 illustrates another connection structure diagram of a pixel circuit and a light emitting element in the subpixel in the Q region in FIG. 1. In one embodiment, the pixel circuit 10 includes a reset transistor T0, a first electrode of the reset transistor T0 is connected to the anode of the light emitting element 20, and a second electrode of the reset transistor T0 is connected to the reset signal terminal REF1. The pixel circuit 10 may further include a drive transistor DT, the second electrode of the first transistor T1 is connected to a drain of the drive transistor DT, and the drain of the drive transistor DT is electrically connected to the anode of the light emitting element 20.

In the pixel circuit 10, the second electrode of the first transistor T1 is electrically connected to an anode of the light emitting element 10. As shown in FIG. 6, the second electrode of the first transistor T1 is also connected to the drain of the drive transistor DT. The first electrode of the first transistor T1 is connected to the first reference voltage signal terminal RV1. The first transistor T1 may be a bias adjustment transistor for adjusting performance of the drive transistor DT. Since in a non-biased stage such as a light emitting stage, a situation that a potential of the gate of the drive transistor DT may be greater than a potential of the drain of the drive transistor DT in the pixel circuit may exist. If the situation lasts for a long time, it is easy to cause an ion polarization inside the drive transistor DT, form a built-in electric field inside the drive transistor DT, and cause a characteristic curve of the drive transistor DT to drift, thereby affecting a display effect of the light emitting element 20. Therefore, in one embodiment, a voltage bias adjustment stage is set to be included in a working process of the pixel circuit 10. In the voltage bias adjustment stage, the first transistor T1 (a bias adjustment transistor) is turned on, and transmits a signal provided by the first reference voltage signal terminal RV1 to the drain of the drive transistor DT to alleviate a threshold voltage shift of the drive transistor DT. The first reference voltage signal terminal RV1 provides a bias adjustment voltage, that is, the first transistor T1 may be multiplexed as a bias adjustment transistor. That is, in the voltage bias adjustment stage of the pixel circuit 10, the first transistor T1 is turned on, the bias adjustment voltage is transmitted to the drive transistor DT, and the characteristic curve of the drive transistor DT is adjusted. In a display stage (i.e., a light emitting stage of the light emitting element 20), the first transistor T1 is turned off, and the first reference voltage signal terminal RV1 transmits a negative potential signal or a ground potential signal. Differential designs of width-to-length ratios of the channel regions of the first transistors T1 in the subpixels 00 of different colors can balance display effects of the subpixels of different colors and avoid color shifts of the light emitting elements 20 of different colors at a low grayscale, thereby improving a display effect of the display panel 000 at a low grayscale.

In the embodiment, an electrical connection between the second electrode of the first transistor T1 and the anode of the light emitting element 10 can be understood as an electrical connection between the second electrode of the first transistor T1 and the anode of the light emitting element 10 realized by various ways. For example, if no other structures are included between the second electrode of the first transistor T1 and the anode of the light emitting element 10, the second electrode of the first transistor T1 and the anode of the light emitting element 10 can be directly connected to realize the electrical connection. If other structures are included between the second electrode of the first transistor T1 and the anode of the light emitting element 10, e.g., the pixel circuit 10 may further include a light emitting control transistor connected to the anode of the light emitting element 20, when the light emitting control transistor is turned on, the electrical connection can also be realized between the second electrode of the first transistor T1 and the anode of the light emitting element 10. A specific structure of the electrical connection between the second electrode of the first transistor T1 and the anode of the light emitting element 10 can be understood according to an actual design structure of the pixel circuit during specific implementation, which is not limited herein. In the embodiment, an electrical connection between the drain of the drive transistor DT and the anode of the light emitting element 10 can be understood that, for example, the pixel circuit 10 may further include a light emitting control transistor connected to the anode of the light emitting element 20. When the light emitting control transistor is turned on, the electrical connection between the drain of the drive transistor DT and the anode of the light emitting element 10 can be realized.

The embodiment only exemplarily illustrates a connection structure included in the pixel circuit 10. During specific implementation, a structure of the pixel circuit 10 includes but is not limited to the connection structure in the pixel circuit 10 illustrated in the embodiment and may also include other structures that are conducive to driving the light emitting element 20 to emit light effectively and to realize a display effect, which is not repeated herein.

Figure 7:
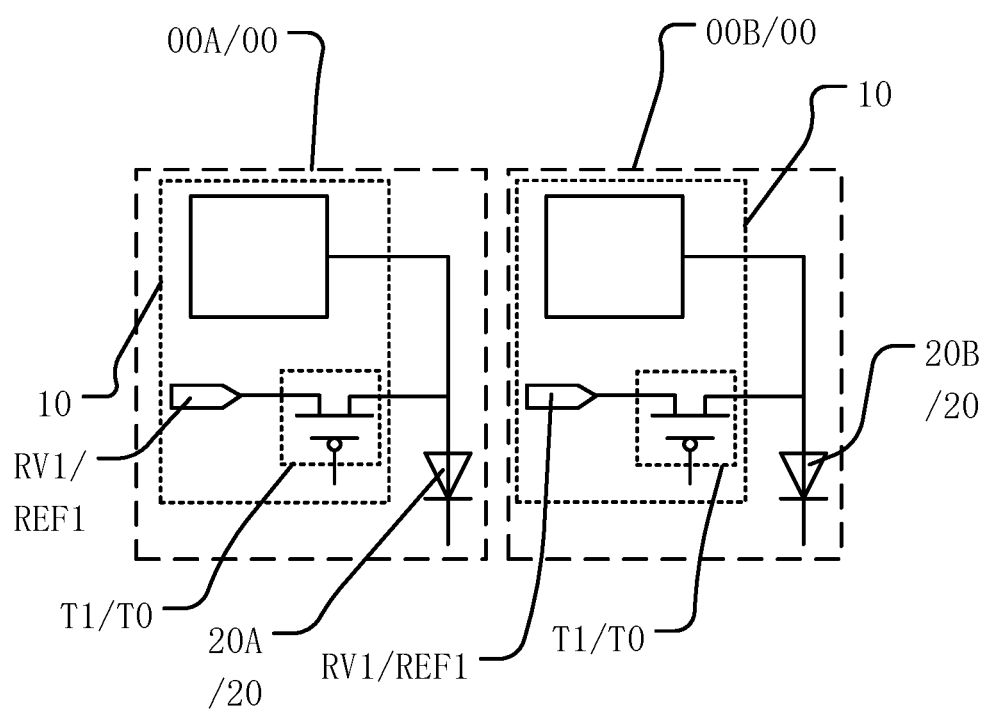
FIG. 7 illustrates another connection structure diagram of a pixel circuit and a light emitting element in a subpixel in the Q region in FIG. 1.

In some optional embodiments, referring to FIG. 1 and FIG. 7, FIG. 7 illustrates another connection structure diagram of a pixel circuit and a light emitting element in a subpixel of the Q region in FIG. 1. In one embodiment, the first transistor T1 is multiplexed into the reset transistor T0, and the first reference voltage signal terminal RV1 is multiplexed into the reset signal terminal REF1.

The embodiment explains that since the first electrode of the first transistor T1 is connected to the first reference voltage signal terminal RV1, the second electrode of the first transistor T1 is connected to the anode of the light emitting element 20. The first reference voltage signal terminal RV1 is configured to transmit a negative potential signal or a ground potential signal to the anode of the light emitting element 20. The first electrode of the reset transistor T0 is also connected to the anode of the light emitting element 20. The second electrode of the reset transistor T0 is connected to the reset signal terminal REF1. A reset signal provided by the reset signal terminal REF1 for the anode of the light emitting element 20 is also a low potential signal. Therefore, the first transistor T1 can be multiplexed as the reset transistor TO, and the first reference voltage signal terminal RV1 can be multiplexed as the reset signal terminal REF1, which is conducive to realizing an anode reset of the light emitting element 20 in the pixel circuit 10 through the reset transistor T0 (the first transistor T1). By making width-to-length ratios of the channel regions of the reset transistors TO (the first transistors T1) different in the subpixels 00 of different colors to solve problems of color shift and light stealing, which is also conducive to reducing number of transistors in the pixel circuit 10, thereby reducing a total number of transistors in the display panel 000 and improving a transmittance of the display panel.

Figure 8:
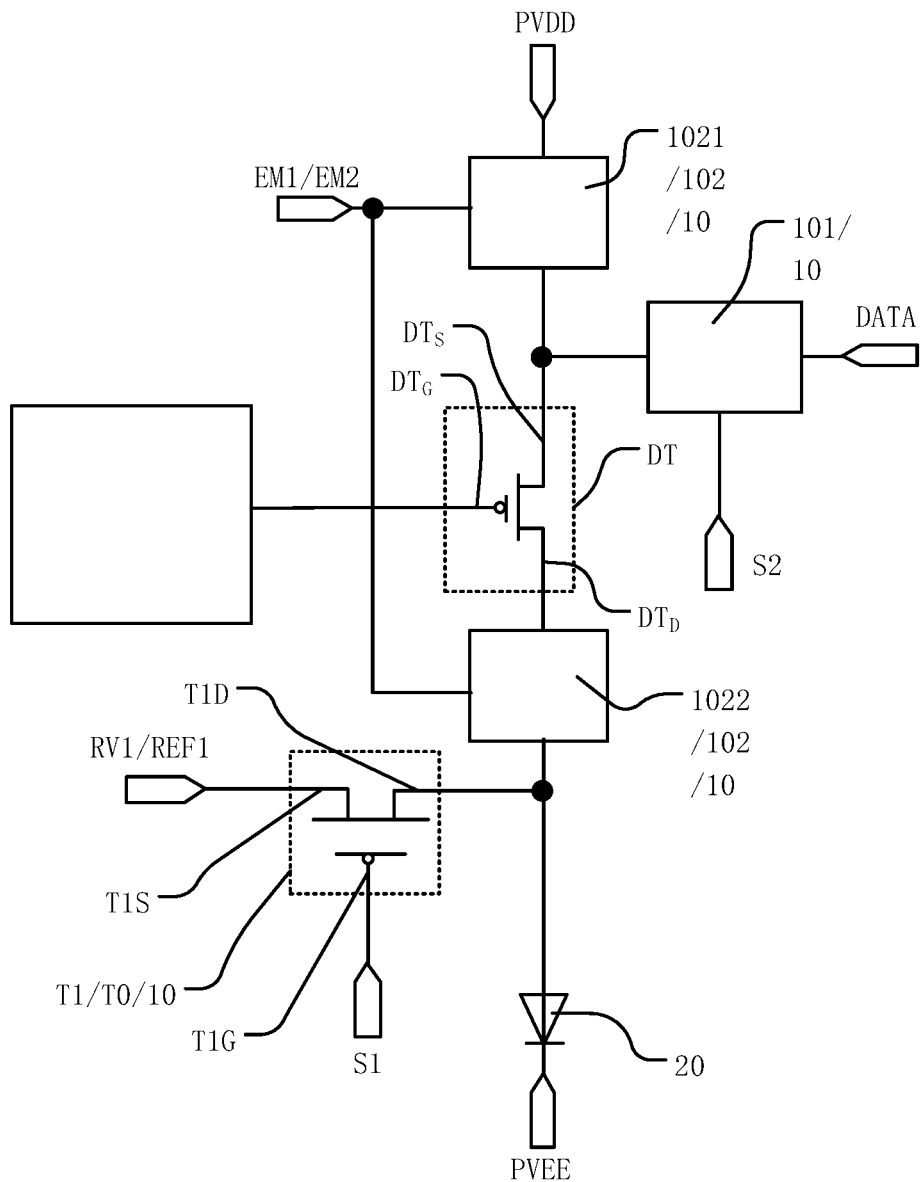
FIG. 8 illustrates a connection structure diagram of a pixel circuit and a light emitting element in a subpixel in FIG. 1.

In some optional embodiments, referring to FIG. 1 and FIG. 8, FIG. 8 illustrates a connection structure diagram of a pixel circuit and a light emitting element in a subpixel in FIG. 1. In one embodiment, the pixel circuit 10 further includes a drive transistor DT, a data writing module 101 and a light emitting control module 102. The light emitting control module 102 is electrically connected to a first voltage signal terminal PVDD and the anode of the light emitting element 20 respectively. A cathode of the light emitting element 20 is electrically connected to a second power signal terminal PVEE. The drive transistor DT is electrically connected to the lighting control module 102 and the data writing module 101 respectively.

The embodiment explains that the pixel circuit 10 includes the first transistor T1. The first transistor T1 being multiplexed into the reset transistor T0 is taken as an example for illustration. An output terminal of the first transistor T1 is connected to the anode of the light emitting element 20 for resetting the anode of the light emitting element 20 in a reset stage. In addition, in the sub-pixels 00 of different colors, width-length ratios of the channel regions of the first transistors T1 are set to be different to solve problems of color shift and light stealing.

The pixel circuit 10 further includes the drive transistor DT, the data writing module 101, and the light emitting control module 102. The drive transistor DT is configured to provide a drive current in a light emitting stage. The light emitting control module 102 is connected in series between the first power signal terminal PVDD and the light emitting element 20. The light emitting control module 102 is electrically connected to the first power signal terminal PVDD and the anode of the light emitting element 20 respectively. The cathode of the light emitting element 20 is electrically connected to the second power signal terminal PVEE. The light emitting control module 102 is configured to provide the light emitting element 20 with a light emitting signal in a light emitting stage. The light emitting element 20 is connected in series between the drive transistor DT and the second power supply signal terminal PVEE for emitting light in response to the drive current.

Optionally, in one embodiment, as shown in FIG. 8, the lighting control module 102 may include a first lighting control module 1021 and a second lighting control module 1022. One end of the first lighting control module 1021 is connected to the first power signal terminal PVDD. The first power signal terminal PVDD inputs a first voltage signal to the first lighting control module 102. The first power signal terminal PVDD can be connected to a first power signal line (not shown) in the display panel 000. Another end of the first lighting control module 1021 is connected to a source DTs of the drive transistor DT. One end of the second light emitting control module 1022 is connected to a drain DTD of the drive transistor DT. Another end of the second light emitting control module 1022 is connected to the anode of the light emitting element 20 for realizing paths between the first power signal terminal PVDD, the first lighting control module 102, the drive transistor DT, the second lighting control module 103, the lighting element 20, and the second power signal terminal PVEE. The first lighting control module 1021 and the second lighting control module 1022 may further include a first light emitting signal terminal EM1 and a second light emitting signal terminal EM2 respectively. The first light emitting signal terminal EM1 and the second light emitting signal terminal EM2 are configured for inputting a light emitting enable signal. Specifically, a first terminal of the first lighting control module 1021 can be electrically connected to the first power signal terminal PVDD to input a first voltage signal. The cathode of the light emitting element 20 is electrically connected to the second power signal terminal PVEE to input a second voltage signal. The second power signal terminal PVEE can be connected to a second power signal line (not shown) in the display panel 000. Level values of the first voltage signal and the second voltage signal are different. a level value of the first voltage signal can be set greater than a level value of the second voltage signal. The first light emitting signal terminal EM1 of the first light emitting control module 1021 is configured to receive the first light emitting signal of the pixel circuit 10, a second light emitting signal terminal EM2 of the second light emitting control module 1022 is configured to receive the second light emitting signal of the pixel circuit 10, so that the first light emitting control module 1021 and the second light emitting control module 1022 are turned on in a light emitting stage to provide a current path for the light emitting element 20 to emit light. The first lighting control module 1021 and the second lighting control module 1022 are controlled to be turned off in another stage such as a reset stage or a data writing stage to prevent the light emitting element 20 from erroneously emitting light in a non-lighting stage. Optionally, as shown in FIG. 8, the first light emitting signal terminal EM1 and the second light emitting signal terminal EM2 can be connected to receive a same light emitting signal EM. That is, A first light emitting signal for turning on the first lighting control module 1021 and a second light emitting signal for turning on the second lighting control module 1022 can be shared, which is conducive to reducing number of signal lines in the display panel, improve a transmittance of the display panel or increase a wiring space of the display panel.

Optionally, as shown in FIG. 8, in one embodiment, when the first transistor T1 is configured as the reset transistor T0, an input terminal of the first transistor T1 is connected to the first reference voltage signal terminal RV1 (the reset signal terminal REF1). The first reference voltage signal terminal RV1 receives a first reset signal for providing the first reset signal for the first transistor T1. The output terminal of the first transistor T1 is connected to the anode of the light emitting element 20. The first reference voltage signal terminal RV1 resets the anode of the light emitting element 20 by receiving a first reset signal. Optionally, the first transistor T1 may further include a first gate T1G configured to receive a first reset enable signal. The first reset enable signal may be a first scan signal S1 shown in FIG. 8. When the first gate T1G of the first transistor T1 in response to the first scan signal is turned on, the first reset signal of the first reference voltage signal terminal RV1 is transmitted to the anode of the light emitting element 20. The first reset signal can reset the anode of the light emitting element 20 with a low-level potential of the first reset signal.

Optionally, in one embodiment, as shown in FIG. 8, an input terminal of the data writing module 101 is connected to a data voltage signal terminal DATA. An output terminal of the data writing module 101 is connected to the source DTs of the drive transistor DT. The data voltage signal terminal DATA can be connected to a data line (not shown) in the display panel 000 for receiving a data voltage signal on a data line. A control terminal S2 of the data writing module 101 may be used to receive a data writing enable signal, and the data writing enable signal may be a second scan signal. That is, the data write enable signal received by the control terminal S2 of the data write module 101 and the first reset enable signal received by the first gate T1G of the first transistor T1 may both be the second scan signal. When the control terminal S2 of the data writing module 101 responds to the second scan signal, the data writing module 101 is in an on state to transmit a data voltage signal of the data voltage signal terminal DATA to the source DTs of the drive transistor DT, and provide the data voltage signal for the drive transistor DT.

The embodiment only illustrates a module structure that the pixel circuit 10 may include. During specific implementation, a connection structure between the pixel circuit 10 and the light emitting element 20 includes but is not limited to the module structure in the pixel circuit 10 or may include another connection structure. The connection structure of the pixel circuit in the light emitting display panel can be understood with reference to a connection structure of the pixel circuit in the organic light emitting display panel in the art, which is not specifically limited herein.

Figure 9:
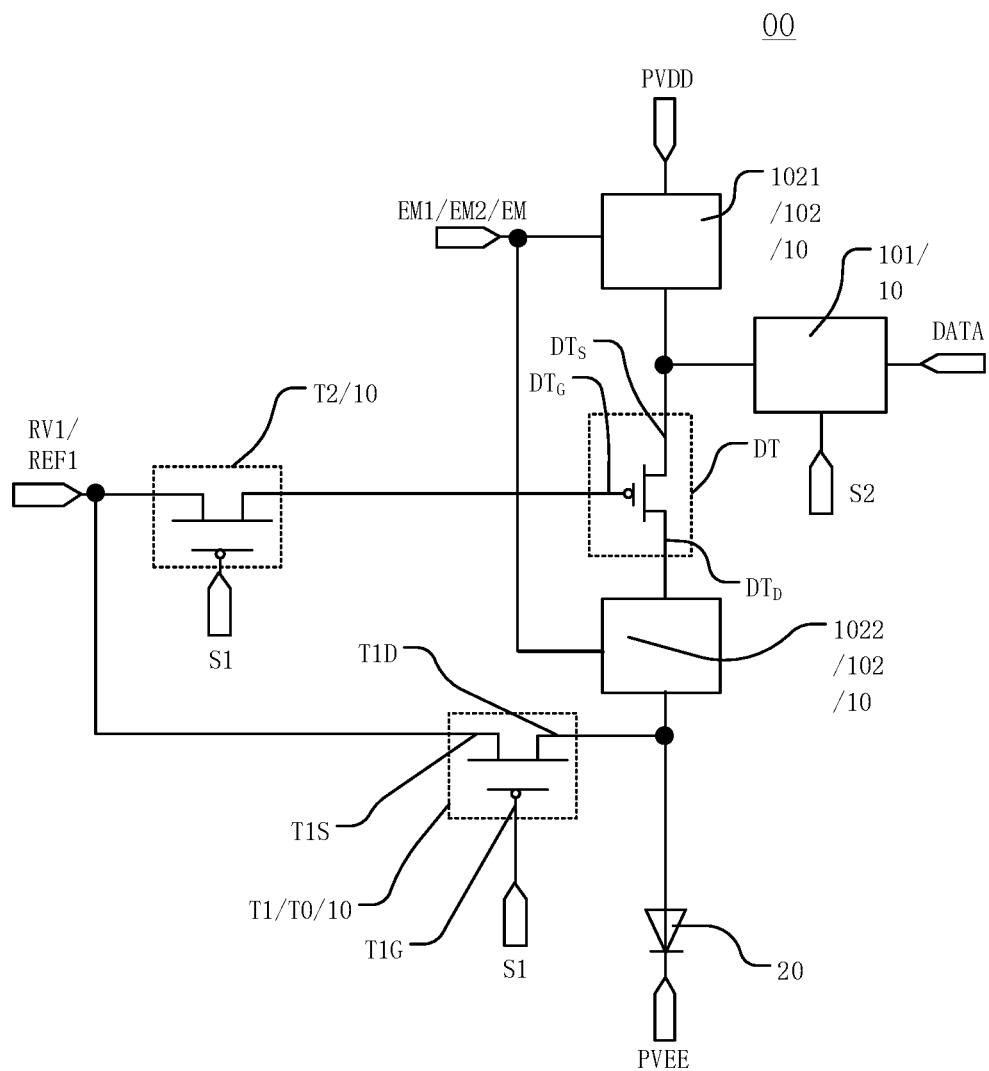
FIG. 9 illustrates another connection structure diagram of a pixel circuit and a light emitting element in a subpixel in FIG. 1.

In some optional embodiments, referring to FIG. 1 and FIG. 9, FIG. 9 illustrates another connection structure diagram of a pixel circuit and a light emitting element in a subpixel in FIG. 1. In one embodiment, the pixel circuit 10 further includes a second transistor T2, A first electrode of the second transistor T2 is connected to the first reference voltage signal terminal RV1. A second electrode of the second transistor T2 is connected to a gate $DT_G$ of the drive transistor DT.

The embodiment explains that the pixel circuit 10 of the display panel 000 may further include the second transistor T2. The first electrode (i.e., an input terminal) of the second transistor T2 can be connected to the first reference voltage signal terminal RV1. The second electrode (i.e., an output terminal) of the second transistor T2 can be connected to the gate $DT_G$ of the drive transistor DT. The second transistor T2 may receive a first reset signal provided by the first reference voltage signal terminal RV1 for resetting the gate $DT_G$ of the drive transistor DT. Optionally, a gate of the second transistor T2 may be the control terminal S2 for receiving a first reset enable signal. The first reset enable signal may be the first scan signal, that is, the first transistor T1 and the second transistor T2 may share the first scan signal as a reset enable signal. When the gate of the second transistor T2 in response to the first scan signal is turned on, the first reset signal provided by the first reference voltage signal terminal RV1 is transmitted to the gate $DT_G$ of the drive transistor DT. The gate $DT_G$ of the drive transistor DT can be reset by using a low-level potential of the first reset signal, so that a conduction of the drive transistor DT after completing a reset operation can be facilitated.

The embodiment only exemplarily illustrates a module structure that the pixel circuit 10 may include. During specific implementation, the connection structure between the pixel circuit 10 and the light emitting element 20 includes but is not limited to the module structure included the pixel circuit 10, and may also include another connection structure, which can be understood with reference to a connection structures of a pixel circuit in an organic light emitting display panel in a related art and are not specifically limited herein.

In the embodiment, When the first transistor T1 and the second transistor T2 play a reset function, the input terminal of the first transistor T1 and an input terminal of the second transistor T2 may be connected to the first reference voltage signal terminal RV1 in common to provide a same first reset signal to reset the gate $DT_G$ of the drive transistor DT and the anode of the light emitting element 20. During specific implementation, the input terminal of the first transistor T1 and the input terminal of the second transistor T2 may also be connected to different reset signals, which are not specifically limited herein.

In the embodiment, both the second transistor T2 and the drive transistor DT are taken as P-type transistors as an example to illustrate. In some other optional embodiments, the second transistor T2 and the drive transistor DT may also be N-type transistors. When the second transistor T2 and the drive transistor DT are P-type transistors, the P-type transistors are turned on when gates thereof are at low potentials, that is, when the second transistor T2 and the drive transistor DT are N-type transistors, the N-type transistors are turned on when gates thereof are at high potentials, thereby realizing transistor conductions. During specific implementation, types of transistors may be set according to actual needs, which is not limited herein.

Figure 10:
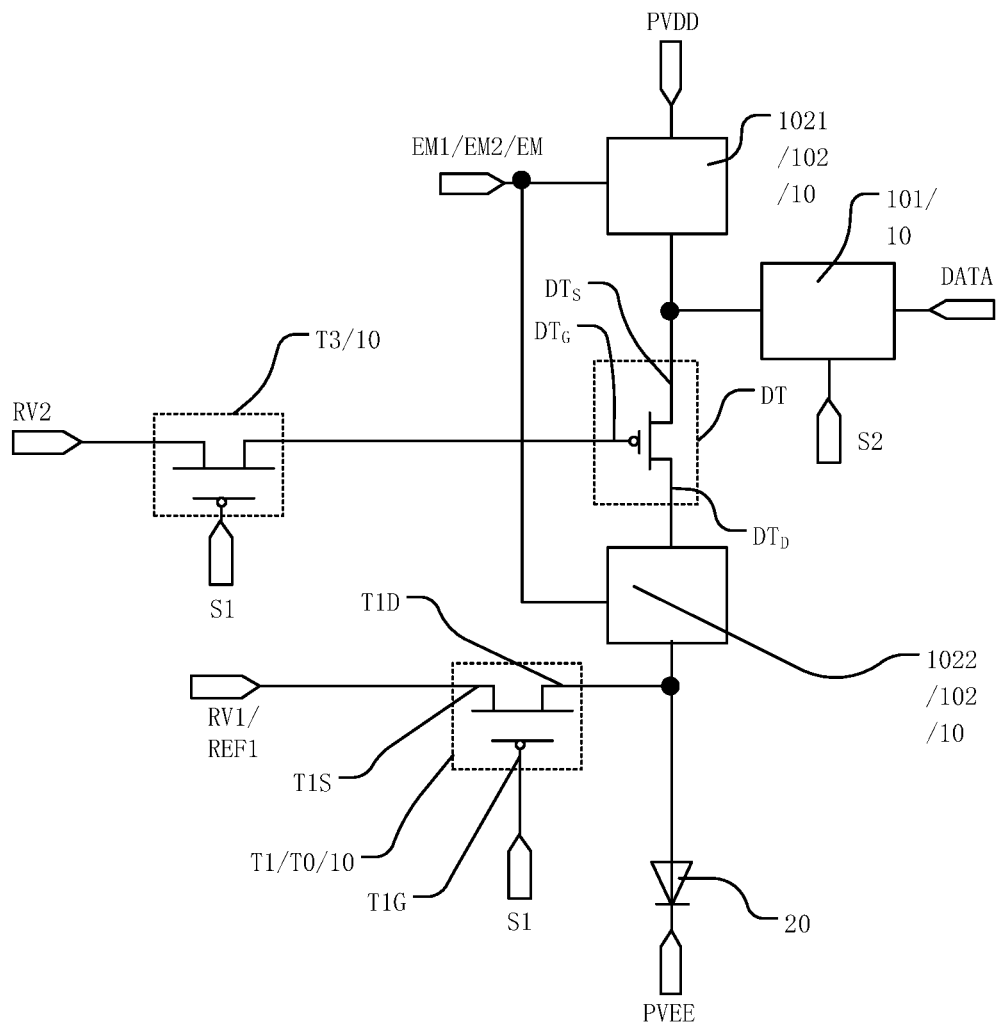
FIG. 10 illustrates another connection structure diagram of a pixel circuit and a light emitting element in a subpixel in FIG. 1.

In some optional embodiments, referring to FIG. 1 and FIG. 10, FIG. 10 illustrates another connection structure diagram of a pixel circuit and a light emitting element in a subpixel in FIG. 1. In one embodiment, the pixel circuit 10 of the display panel 000 further includes a third transistor T3. A first electrode of the third transistor T3 is connected to a second reference voltage signal terminal RV2. A second electrode of the third transistor T3 is connected to a gate $DT_G$ of the drive transistor DT.

A potential connected to the second reference voltage signal terminal RV2 is different from a potential connected to the first reference voltage signal terminal RV1. Optionally, a potential transmitted by the second reference voltage signal terminal RV2 is greater than a potential transmitted by the first reference voltage signal terminal RV1.

The embodiment explains that the pixel circuit 10 of the display panel 000 may further include the third transistor T3. The first electrode (i.e., an input terminal) of the third transistor T3 can be connected to the second reference voltage signal terminal RV2. The second electrode (i.e., an output terminal) of the third transistor T3 may be connected to the gate $DT_G$ of the drive transistor DT. The third transistor T3 may receive a second reset signal provided by the second reference voltage signal terminal RV2 for resetting the gate $DT_G$ of the drive transistor DT. Optionally, a gate of the third transistor T3 may be the control terminal S1 for receiving the first reset enable signal. The first reset enable signal may be a first scan signal. That is, the first transistor T1 and the third transistor T3 can share the first scan signal as a reset enable signal. When the gate of the third transistor T3 in response to the first scan signal is turned on, the second reset signal provided by the second reference voltage signal terminal RV2 is transmitted to the gate $DT_G$ of the drive transistor DT, and the gate $DT_G$ of the drive transistor DT can be reset by using a low-level potential of the second reset signal, so as to facilitate a conduction of the drive transistor DT after a reset operation is completed.

In one embodiment, the display panel 000 may include different first reference voltage signal line and second reference voltage signal line. The first reference voltage signal terminal RV1 may be connected to the first reference voltage signal line (not shown) in the display panel 000, so that the first reset signal of a negative potential signal or a ground potential signal is connected to the first reference voltage signal terminal RV1 through the first reference voltage signal line. The second reference voltage signal terminal RV2 may be connected to the second reference voltage signal line (not shown) in the display panel 000, so that the second reference voltage signal terminal RV2 is connected to the second reset signal through the second reference voltage signal line. Therefore, the first transistor T1 and the third transistor T3 use different reset signals to reset the anode of the light emitting element 20 and the gate $DT_G$ of the drive transistor DT. Through an independent setting of input signals of the first transistor T1 and the second transistor T2, when leakage currents of the first transistors T1 are measured to match width-to-length ratios of the corresponding first transistors T1 in different pixel circuits, it is easier to determine and distinguish if a leakage current in the pixel circuit 10 is a leakage current of the first transistor T1, thereby avoiding that when the first transistor T1 and the second transistor T2 are both connected to the first reference voltage signal terminal RV1, it is impossible to distinguish which transistor is leaking to the first reference voltage signal terminal RV1 when a leakage current occurs.

In one embodiment, the potential connected to the second reference voltage signal terminal RV2 is different from the reference voltage connected to the first reference voltage signal terminal RV1. Optionally, the potential connected to the second reference voltage signal terminal RV2 is greater than the potential connected to the first reference voltage signal terminal RV1.

Since the potential connected to the second reference voltage signal terminal RV2 cannot be too low, if the potential connected to the second reference voltage signal terminal RV2 is too low, when the data writing module 101 writes a fixed data signal into the drive transistor DT in a data writing stage, the potential connected to the second reference voltage signal terminal RV2 lowers an original potential of the gate $DT_G$ of the drive transistor DT to a very low level, which is likely to cause an insufficient charging of the gate $DT_G$ of the drive transistor DT especially when the display panel is driven to display at a high refresh rate, thereby greatly affecting a the display effect. The potential connected to the first reference voltage signal terminal RV1 is expected to be lower to reset the anode of the light emitting element 20 more thoroughly, thereby improving a residual of a data signal of a previous frame in a display process, improving an afterimage phenomenon and a display effect, and reducing an occurrence of light stealing of subpixels caused by a lateral leakage current between the light emitting elements 20 of adjacent subpixels.

In one embodiment, the first reference voltage signal terminal RV1 and the second reference voltage signal terminal RV2 are set to be independent of each other. The potential connected to the second reference voltage signal terminal RV2 is different from the potential connected to the first reference voltage signal terminal RV1. When the potential connected to the first reference voltage signal terminal RV1 needs to be lowered down to improve a light stealing of the light emitting element 20, the potential connected to the second reference voltage signal terminal RV2 does not need to be lowered down as the potential connected to the first reference voltage signal terminal RV1 is lowered down. Therefore, after the gate $DT_G$ of the drive transistor DT is reset, when a data signal is written into the gate $DT_G$ of the drive transistor DT, the data signal can be written based on a relatively high potential connected to a the second reference voltage signal terminal RV2, which is conducive to reducing a voltage difference between an initial potential of the gate $DT_G$ of the drive transistor DT and the data signal to be written, so that the data signal can be written more fully in a data writing stage.

The embodiment does not specifically limit types of the potential connected to the second reference voltage signal terminal RV2 and the potential connected to the first reference voltage signal terminal RV1. The potential connected to the second reference voltage signal terminal RV2 and the potential connected to the first reference voltage signal terminal RV1 may both be DC signals, or the second reference voltage signal terminal RV2 may be a square wave AC signal, the potential connected to the first reference voltage signal terminal RV1 may be a DC signal, or another type of signal, as long as the potential connected to the second reference voltage signal terminal RV2 is greater than the potential connected to the first reference voltage signal terminal RV1, which is not specifically limited herein.

Figure 11:
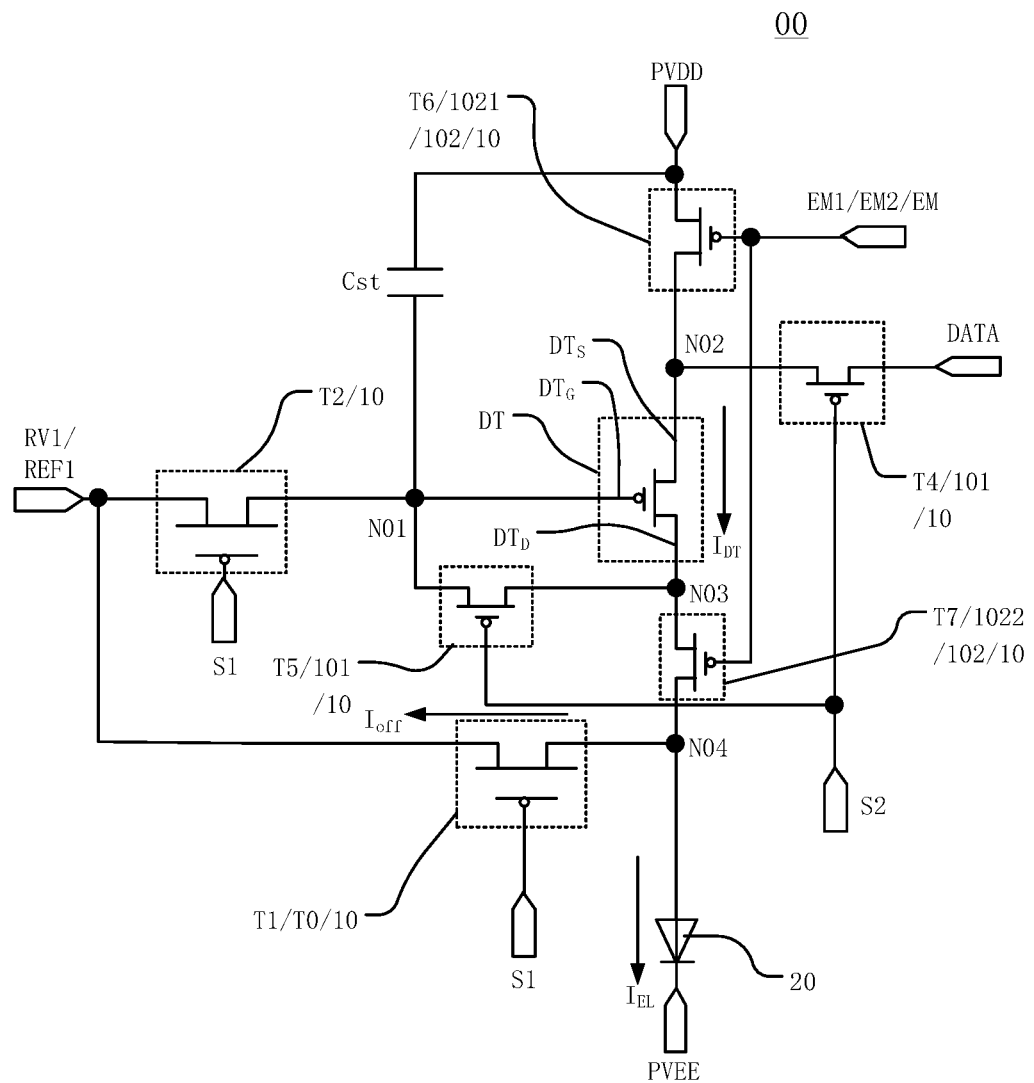
FIG. 11 illustrates a connection structure diagram of a specific circuit in FIG. 9.
Figure 12:
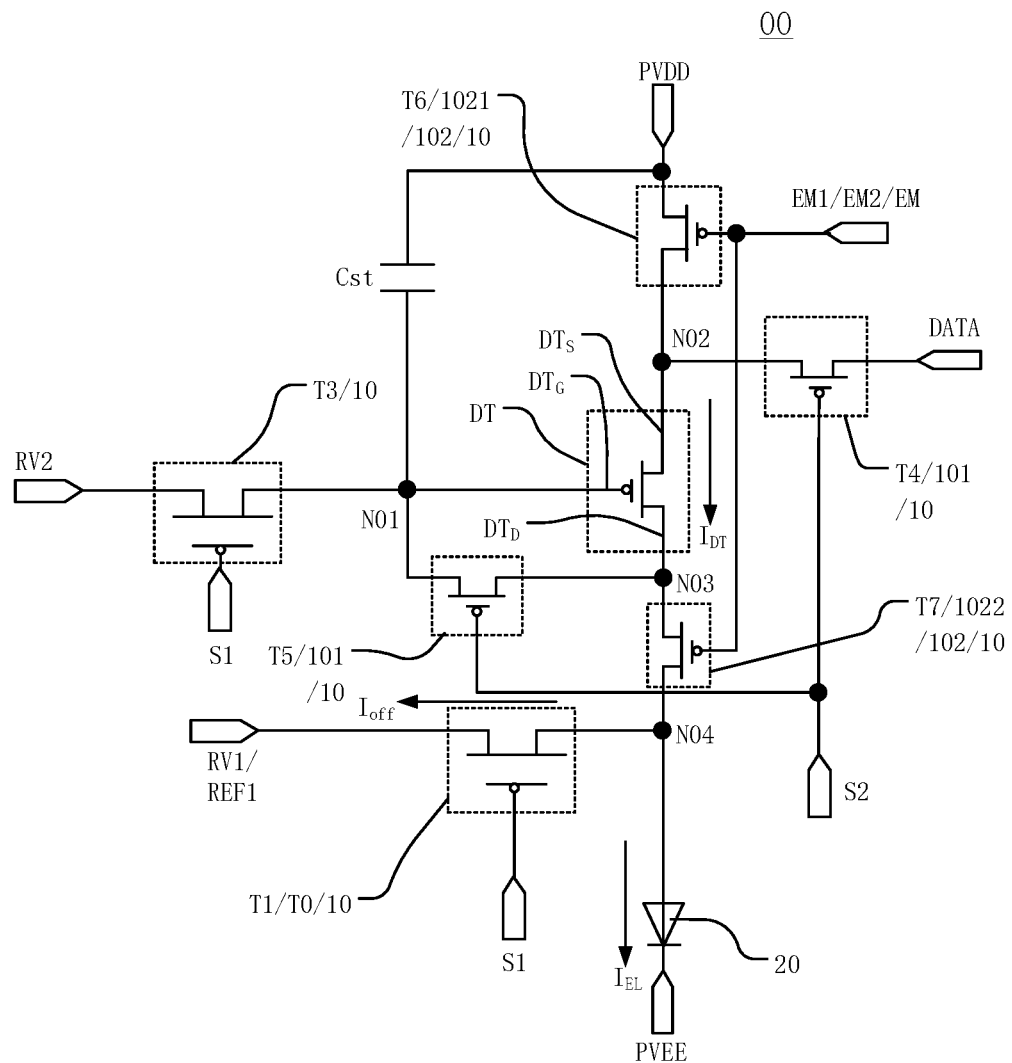
FIG. 12 illustrates a connection structure diagram of a specific circuit in FIG. 10.
Figure 13:
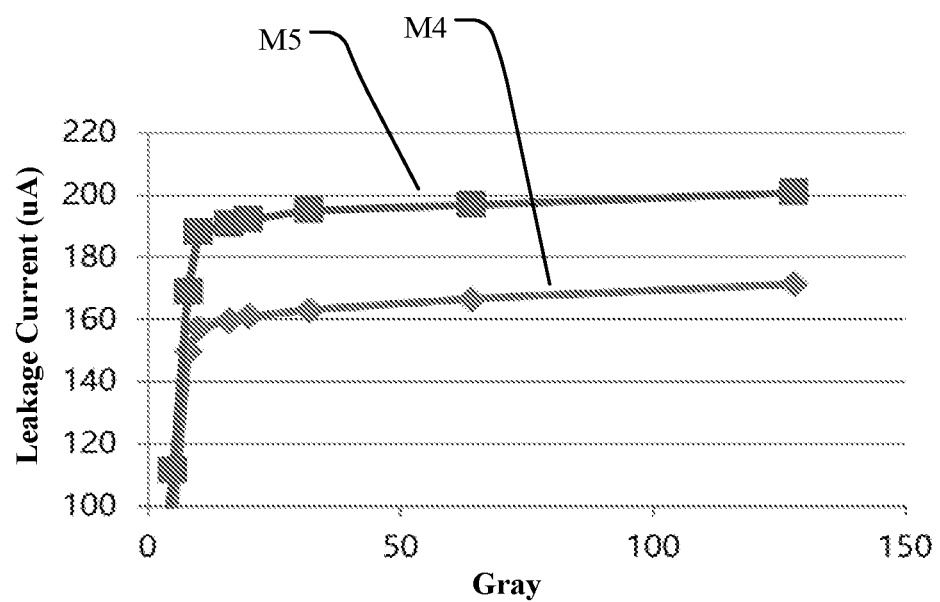
FIG. 13 illustrates a leakage current data graph measured at a low grayscale after changing a width-to-length ratio of channel regions of different first transistors in a pixel circuit in FIG. 11.

In some optional embodiments, referring to FIG. 1, FIG. 4, and FIGS. 10-12, FIG. 11 illustrates a connection structure diagram of a specific circuit in FIG. 9, FIG. 12 illustrates a connection structure diagram of a specific circuit in FIG. 10, and FIG. 13 illustrates a diagram of leakage current data measured at a low grayscale after changing a width-to-length ratio of channel regions of different first transistors in a pixel circuit of FIG. 11. In one embodiment, the data writing module 101 includes a first data writing transistor T4 and a second data writing transistor T5. A first electrode of the first data writing transistor T4 is connected to the data voltage signal terminal DATA. A second electrode of the first data writing transistor T4 is connected to the first electrode of the drive transistor DT which may be the source DTs of the drive transistor DT. A first electrode of the second data writing transistor T5 is connected to the gate $DT_G$ of the drive transistor DT. A second electrode of the second data writing transistor T5 is connected to the second electrode of the drive transistor DT which may be the drain DTD of the drive transistor DT. Optionally, a gate of the first data writing transistor T4 and the gate of the second data writing transistor T5 may be jointly connected to a second scan signal. That is, when the gate of the first data writing transistor T4 and the gate of the second data writing transistor T5 jointly respond to the second scan signal, the first data writing transistor T4 and the second data writing transistor T5 are in an on state.

The first lighting control module 1021 of the lighting control module 102 includes a first light emitting control transistor T6. The second lighting control module 1022 of the lighting control module 102 includes a second light emitting control transistor T7. A first electrode of the first light emitting control transistor T6 is connected to the first voltage signal terminal PVDD. A second electrode of the first light emitting control transistor T6 is connected to the first electrode of the drive transistor DT which may be the source DTs of the drive transistor DT. A first electrode of the second light emitting control transistor T7 is connected to the second electrode of the drive transistor DT which may be the drain DTD of the drive transistor DT. A second electrode of the second light emitting control transistor T7 is connected to the anode of the light emitting element 20. Optionally, a gate of the first light emitting control transistor T6 and a gate of the second light emitting control transistor T7 may be jointly connected to a same light emitting signal. That is, when the gate of the first light emitting control transistor T6 and the gate of the second light emitting control transistor T7 jointly respond to the light emitting signal, the first light emitting control transistor T6 and the second light emitting control transistor T7 are in an on state.

The first lighting control module 1021 of the lighting control module 102 further includes a storage capacitor Cst. One end of the storage capacitor Cst is connected to the first voltage signal terminal PVDD, and another end of the storage capacitor Cst is connected to the gate $DT_G$ of the drive transistor DT. Optionally, the storage capacitor Cst is configured to stabilize a potential of the gate $DT_G$ of the drive transistor DT, which is conducive to keeping the drive transistor DT on.

The embodiment explains a circuit connection structure that the pixel circuit 10 in the display panel 000 may include. The pixel circuit 10 includes a plurality of transistors and the storage capacitor Cst. One transistor of the plurality of transistors is a drive transistor DT, and remaining transistors are switching transistors. In the embodiment, an electrical connection structure between the pixel circuit 10 and the light emitting element 20 shown in FIG. 11 is taken as an example. The gate $DT_G$ of the drive transistor DT represents a first node N01, the source DTS of the drive transistor DT represents a second node N02, the drain DTD of the drive transistor DT represents a third node N03, and the anode of the light emitting element 20 serves as a fourth node N04. A working principle of the pixel circuit 10 is described below.

In an initial reset stage, the first transistor T1 and the third transistor T3 are turned on, and remaining transistors are turned off. A potential of the first node N01 is a second reset signal Vref2 provided by the second reference voltage signal terminal RV2. A potential of the fourth node N04 is a first reset signal Vref1 provided by the first reference voltage signal terminal RV1. The gate $DT_G$ of the drive transistor DT and the anode of the light emitting element 20 are reset.

In a data writing and threshold capture stage, the first data writing transistor T4, the second data writing transistor T5, and the drive transistor DT are turned on, and remaining transistors are turned off. A potential of the second node N02 is a data voltage signal Vdata provided by the data voltage signal terminal DATA, a potential difference between the first node N01 and the third node N03 is Vdata−|Vth|, and Vth is a threshold voltage of the drive transistor DT.

In a light emitting stage, the first light emitting control transistor T6, the second light emitting control transistor T7, and the drive transistor DT are turned on, and remaining transistors are turned off. A first voltage signal Vpvdd of the first voltage signal terminal PVDD is transmitted to the drive transistor DT. The drive transistor DT generates a drive current to drive the light emitting element 20 to emit light. The potential of the second node N02 is the first voltage signal Vpvdd. The potential of the first node N01 is Vdata−|Vth|. The potential of the third node N03 is Vpvee+Voled. Vpvee is a second voltage signal provided by the second power signal terminal PVEE, which can be a negative potential. Voled is a corresponding voltage on the light emitting element 20. A light emitting current $Id=k(Vgs-|Vth|)^2=k(Vpvdd-Vdata-|Vth|)^2$. A constant k is related to a performance of the drive transistor DT.

In a structure of the connection between the pixel circuit 10 and the light emitting element 20 provided by the embodiment, as shown in FIG. 11, at a low grayscale, part of a drive current $I_{DT}$ provided by the drive transistor DT is supplied to the leakage current of the first transistor T1, which is expressed as Ica. Another part of the drive current $I_{DT}$ is supplied to the light emitting element 20, which is expressed as $I_{EL}$, $I_{DT}=I_{EL}+I_{off}$ at a low grayscale. In the embodiment, by adjusting the width-to-length ratio of the channel region of the first transistor T1 connected to the light emitting elements 20 of different colors, the leakage current $I_{off}$ of the first transistor T1 can be changed. According to experimental data, as shown in FIG. 13, an abscissa represents a low grayscale value, and an ordinate represents the leakage current of the first transistor T1. A curve M4 represents a leakage current when the width-to-length ratio of the channel region of the first transistor T1 is N2. A curve M5 represents a leakage current when the width-to-length ratio of the channel region of the first transistor T1 is N1. The width-to-length ratio N1 of the channel region of the first transistor T1 indicated by the curve M5 is greater than the width-to-length ratio N2 of the channel region of the first transistor T1 indicated by the curve M4. As can be seen from data in FIG. 13, after the width-to-length ratio of the channel region of the first transistor T1 increases, the leakage current $I_{off}$ at a low grayscale increases significantly.

When the light emitting element 20 is an organic light emitting diode, the luminous efficiency of the light emitting element 20 at a low grayscale is $$\gamma_{EL} = \frac{L_{um} \times S}{I_{DT}} = \frac{L_{um} \times S}{I_{EL} + I_{off}}.$$

$\gamma_{EL}$ represents the luminous efficiency of the light emitting element 20 at a low grayscale. $L_{um}$ represents a brightness of the display panel. S represents a display area of the display panel, $L_{um} \times S$ is a fixed value based on a same display panel. The embodiment is aimed at a light emitting element with a high luminous efficiency at a low grayscale such as the light emitting element 20A corresponding to the first subpixel 00A. When the width-to-length ratio of the channel region of the first transistor T1 of the first subpixel 00A is increased, the leakage current $I_{off}$ of the first transistor T1 increases. the $I_{EL}$ of the light emitting element 20A corresponding to the first subpixel 00A remains unchanged, the luminous efficiency of the light emitting element 20A corresponding to the first transistor T1 decreases under a same brightness at a low grayscale, and a stability of the light emitting element 20A is enhanced. Therefore, a brightness increase of the light emitting element 20A in the first subpixel 00A decreases and achieves a same brightness increase as the light emitting element 20B in the second subpixel 00B as far as possible. Eventually, brightness fluctuations of the light emitting elements 20 of different colors under environmental changes are as balanced as possible, so that the light emitting elements 20 of different colors emit light normally at a low grayscale, color shifts are avoided, and white images at a low grayscale are displayed normally. which is conducive to improving a display effect of the display panel 000 at a low grayscale.

In the embodiment, transistors in the pixel circuit 10 are all taken as P-type transistors as an example for illustration. In some other optional embodiments, N-type transistors may also be used, or part of the transistors are N-type transistors and part of the transistors are P-type transistors. When the transistors are P-type transistors, the P-type transistors are turned on when gates thereof at low potentials, that is, when the transistors are N-type transistors, the N-type transistors are turned on when gates thereof at high potentials, thereby realizing transistor conductions. During specific implementation, types of transistors can be set according to actual needs, which is not limited herein.

Figure 14:
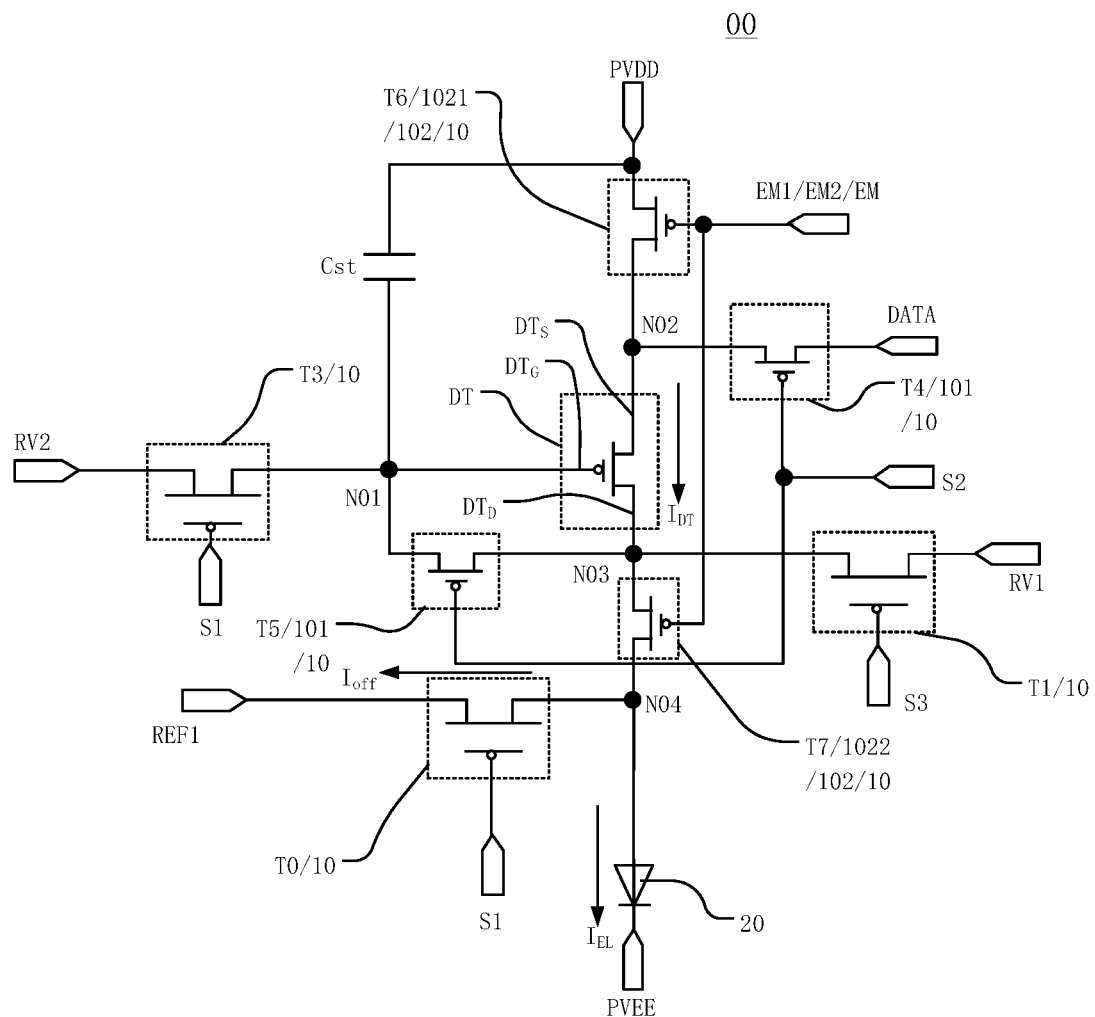
FIG. 14 illustrates another connection structure diagram of a pixel circuit and a light emitting element in a subpixel in FIG. 1.

Optionally, FIG. 14 illustrates another connection structure diagram of a pixel circuit and a light emitting element in a subpixel in FIG. 1. In one embodiment, the pixel circuit 10 includes a reset transistor T0, the first electrode of the reset transistor T0 is connected to the anode of the light emitting element 20, and the second electrode of the reset transistor T0 is connected to the reset signal terminal REF1. The pixel circuit 10 further includes a third transistor T3, the first electrode of the third transistor T3 is connected to the second reference voltage signal terminal RV2, and the second electrode of the third transistor T3 is connected to the gate $DT_G$ of the drive transistor DT. The potential connected to the second reference voltage signal terminal RV2 may be different from the potential connected to the reset signal terminal REF1. The second electrode of the first transistor T1 in the pixel circuit 10 is connected to the drain (i.e., the third node N03) of the drive transistor DT, and the second electrode of the first transistor T1 is connected to the first electrode of the second light emission control transistor T7. Optionally, a gate of the reset transistor T0 and a gate of the third transistor T3 may be connected to a same reset enable signal. When the gate of the reset transistor T0 and the gate of the third transistor T3 jointly respond to the reset enable signal S1 shown in FIG. 14, the reset transistor T0 and the third transistor T3 are in an on state. A gate of the first data writing transistor T4 and a gate of the second data writing transistor T5 may be jointly connected to an enable signal S2. That is, when the gate of the first data writing transistor T4 and the gate of the second data writing transistor T5 jointly respond to the enable signal S2, the first data writing transistor T4 and the second data writing transistor T5 are in an on state. A gate of the first transistor T1 may be connected to an enable signal S3, that is, when the gate of the first transistor T1 responds to the enable signal S3, the first transistor T1 is in an on state.

The embodiment explains that in the pixel circuit 10, the second electrode of the first transistor T1 is electrically connected to the anode of the light emitting element 10, the second electrode of the first transistor T1 is connected to the first electrode of the second light emitting control transistor T7, and the second electrode of the second light emitting control transistor T7 is connected to the anode of the light emitting element 20, so that the second electrode of the first transistor T1 is electrically connected to the anode of the light emitting element 10. As shown in FIG. 14, the second electrode of the first transistor T1 is also connected to the second electrode (i.e., the third node N03) of the drive transistor DT. The first electrode of the first transistor T1 is connected to the first reference voltage signal terminal RV1. The first transistor T1 may be a reverse biased transistor for adjusting performance of the drive transistor DT. Since when a pixel circuit in a non-biased stage such as a light emitting stage, a situation that a potential of the gate of the drive transistor DT may be greater than a potential of the drain of the drive transistor DT in the pixel circuit may occur. If the situation lasts for a long time, it is easy to cause an ion polarization inside the drive transistor DT, form a built-in electric field inside the drive transistor DT, and cause a characteristic curve of the drive transistor DT to drift, thereby affecting a display effect of the light emitting element 20. Therefore, in one embodiment, a voltage bias adjustment stage is set to be included in a working process of the pixel circuit 10. In the voltage bias adjustment stage, the first transistor T1 (i.e., a bias adjustment transistor) is turned on, and transmits a signal provided by the first reference voltage signal terminal RV1 to the drain of the drive transistor DT to alleviate the threshold voltage shift of the drive transistor DT. The first reference voltage signal terminal RV1 provides a bias adjustment voltage, that is, the first transistor T1 may be multiplexed as a bias adjustment transistor. Therefore, in the voltage bias adjustment stage of the pixel circuit 10, the first transistor T1 is turned on, the bias adjustment voltage is transmitted to the drive transistor DT, and the characteristic curve of the drive transistor DT is adjusted. In a display stage (i.e., a light emitting stage of the light emitting element 20), the first transistor T1 is turned off, and the first reference voltage signal terminal RV1 transmits a negative potential signal or a ground potential signal. Differential designs of the channel width-to-length ratios of the first transistors T1 in the subpixels 00 of different colors can balance display effects of the subpixels of different colors and avoid color shifts of the light emitting elements 20 of different colors at a low grayscale, thereby improving a display effect of the display panel 000 at a low grayscale.

In one embodiment, an electrical connection between the second electrode of the first transistor T1 and the anode of the light emitting element 10 can be understood as the electrical connection between the second electrode of the first transistor T1 and the anode of the light emitting element 10 realized by various ways. For example, if no other structure is included between the second electrode of the first transistor T1 and the anode of the light emitting element 10, the second electrode of the first transistor T1 and the anode of the light emitting element 10 can be directly connected to realize the electrical connection. If other structures are included between the second electrode of the first transistor T1 and the anode of the light emitting element 10, e.g., the pixel circuit 10 may further include a light emitting control transistor connected to the anode of the light emitting element 20, when the light emitting control transistor is turned on, the electrical connection can also be realized between the second electrode of the first transistor T1 and the anode of the light emitting element 10. A specific structure of the electrical connection between the second electrode of the first transistor T1 and the anode of the light emitting element 10 can be understood according to an actual design structure of the pixel circuit during specific implementation, which is not limited herein.

Figure 15:
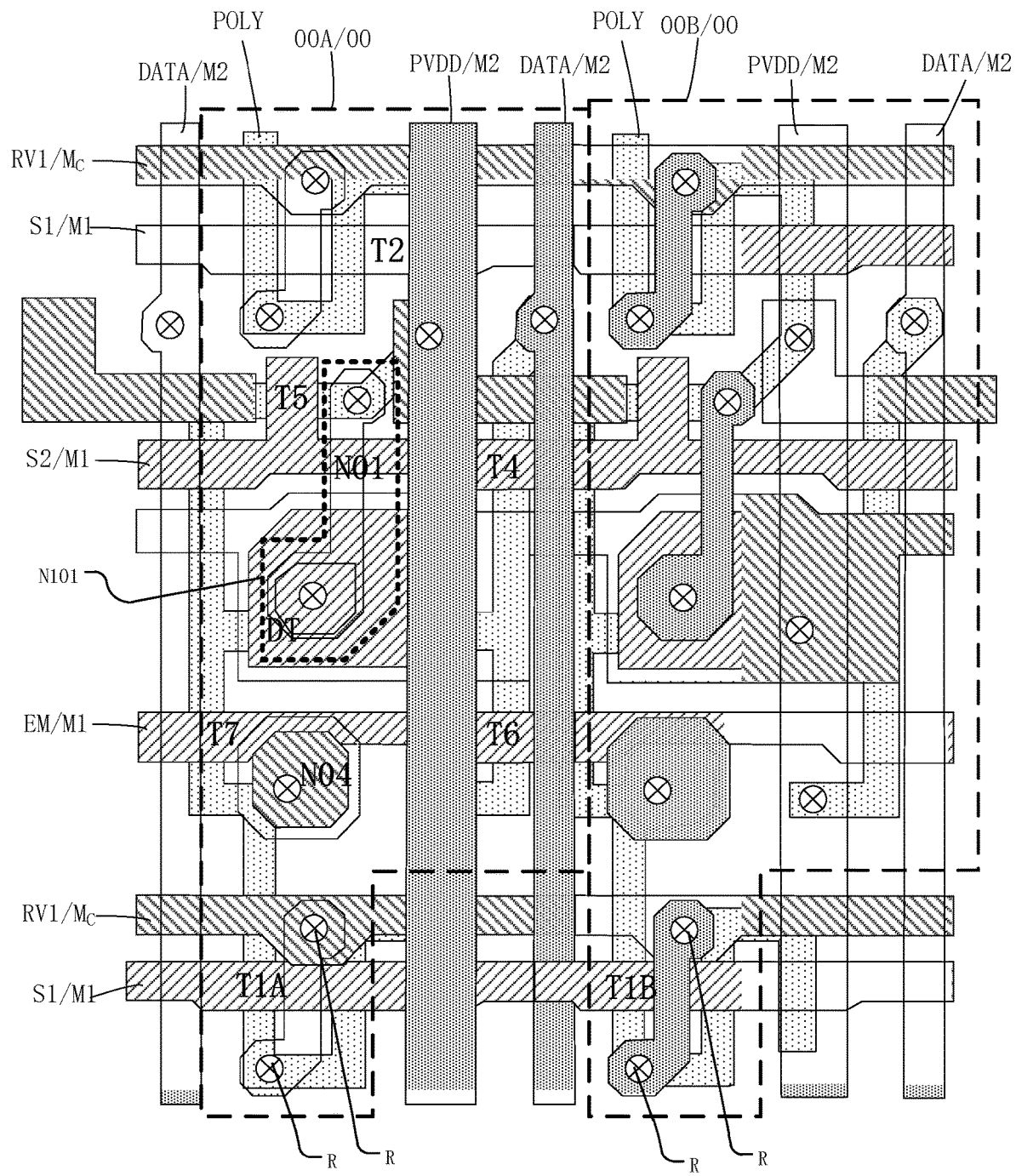
FIG. 15 illustrates a circuit layout when a circuit structure in FIG. 11 is formed on a display panel.
Figure 16:
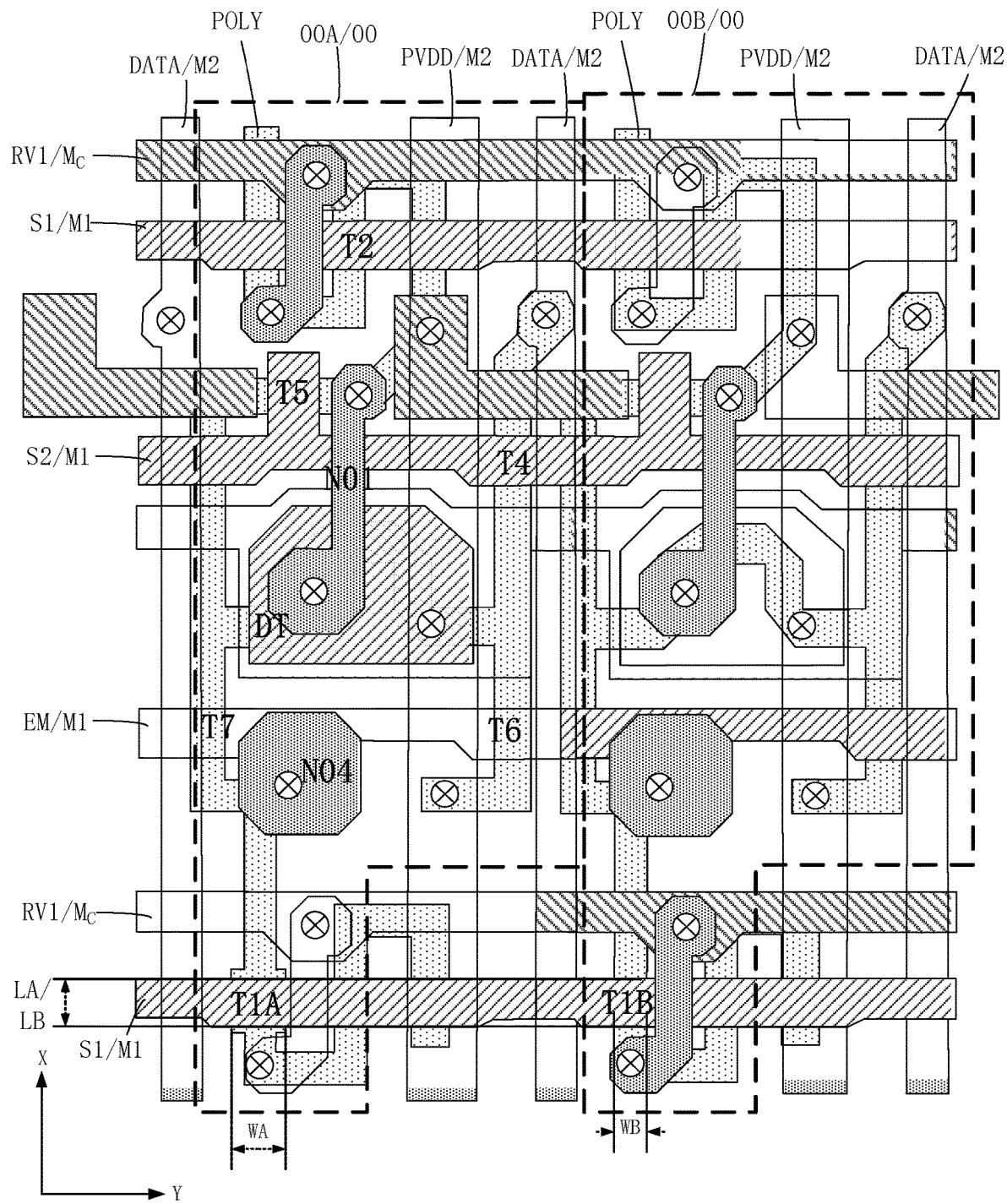
FIG. 16 illustrates another circuit layout when a circuit structure in FIG. 11 is formed on a display panel.
Figure 17:
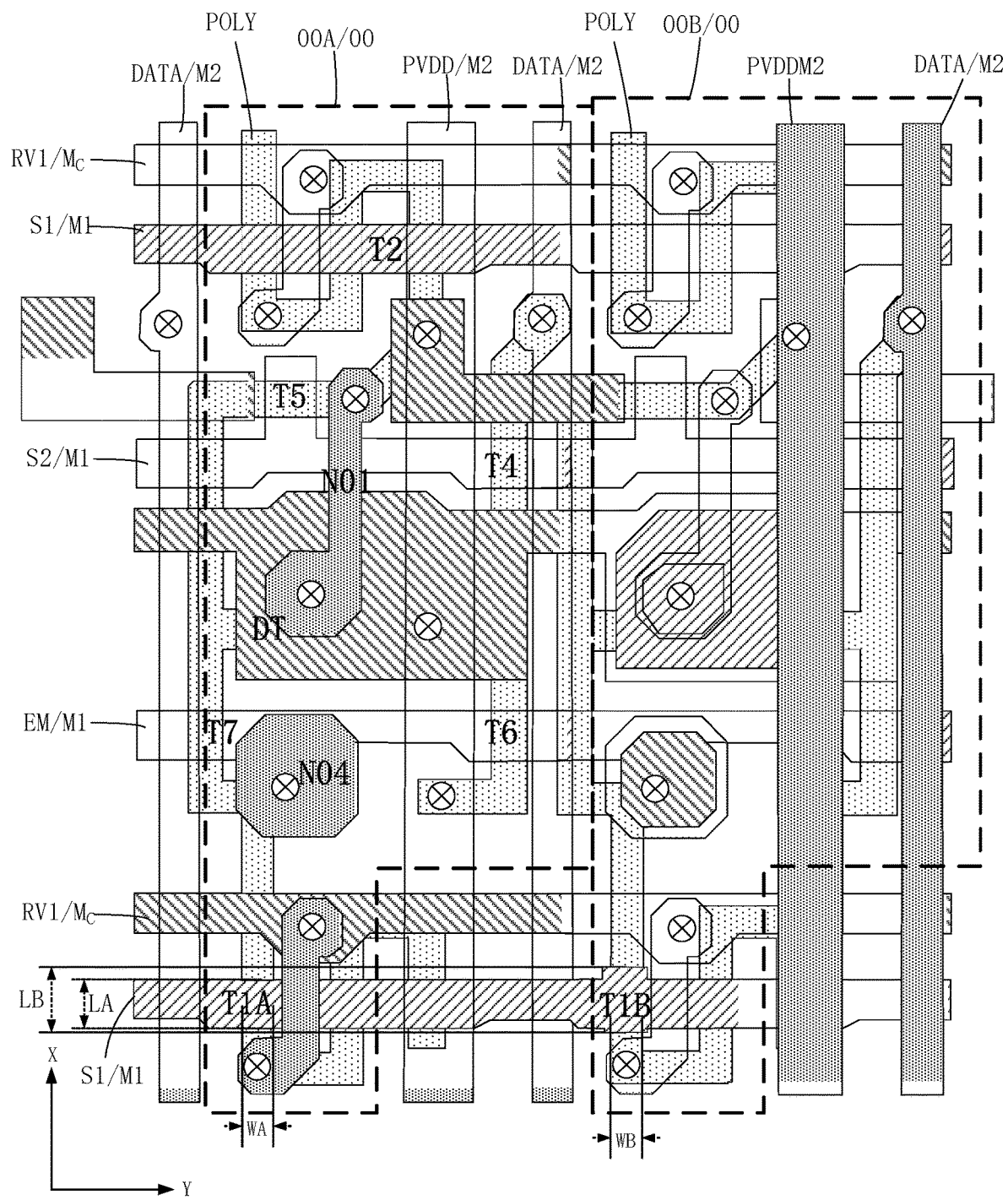
FIG. 17 illustrates another circuit layout when a circuit structure in FIG. 11 is formed on a display panel.

In some optional embodiments, referring to FIG. 1, FIG. 4, FIGS. 10-13, and FIGS. 15-17, FIG. 15 illustrates a circuit layout when a circuit structure in FIG. 11 is formed on a display panel, FIG. 16 illustrates another circuit layout when a circuit structure in FIG. 11 is formed on a display panel, and FIG. 17 illustrates another circuit layout when a circuit structure in FIG. 11 is formed on a display panel. The embodiments only illustrate a layout of a circuit structure corresponding to FIG. 11. During specific implementation, a circuit layout can also be designed in FIG. 12, a difference between the circuit layouts in FIG. 11 and FIG. 12 is only that the first reference voltage signal terminal RV1 and the second reference voltage signal terminal RV2 in FIG. 12 are separately set. As shown in FIG. 15, when the pixel circuit 10 in the display panel 000 is formed on the substrate 01 of the display panel 000, the pixel circuit 10 can be illustrated as the circuit layout of FIG. 15. A film layer structure of the display panel 000 may at least include a first metal layer M1, a second metal layer M2, a third metal layer Mc, and an active layer POLY. The first metal layer M1 can be configured to form a first scan signal line S1 for the first transistor T1 and the second transistor T2, a second scan signal line S2 for the gate of the first data writing transistor T4 and the gate of the second data writing transistor T5, a light emitting signal EM for the gate of the first light emitting control transistor T6 and the gate of the second light emitting control transistor T7 and gates of various transistors in the display panel 000. The second metal layer M2 can be configured to form the data voltage signal Vdata for the data voltage signal terminal DATA and the first voltage signal Vpvdd for the first power signal terminal PVDD, the second voltage signal Vpvee for the second power supply signal terminal PVEE and sources and drains of various transistors in the display panel 000. The third metal layer Mc can be configured to form a first reset signal for the first reference voltage signal terminal RV1. The active layer POLY can be configured to form an active part or a source/drain of each transistor.

Optionally, the film layer structure of the display panel may further include a fourth metal layer (not shown). At least one of a data line and a first power signal line or a first reference voltage signal line may also be on the fourth metal layer, which can effectively reduce a signal line density in a single-layer metal film layer structure and a projected area of an overall structure of the pixel circuit 10 on the substrate 01 and improve a pixel density of the display panel. Optionally, the data line can be arranged on the fourth metal layer. Therefore, in a direction perpendicular to the substrate 01, the film layer where the data line is located can be farther away from the film layer where the drive transistor DT is located, which is conducive to reducing a signal crosstalk between the data line that provides the data voltage signal terminal DATA with the data voltage signal Vdata and the gate connection structure N101 of the drive transistor DT which can refer to a structure indicated by a dotted box in FIG. 15, improve a stability of a gate signal of the drive transistor DT, and improve a display effect. Optionally, when the data line is disposed on the fourth metal layer, the first power signal line that provides the first voltage signal Vpvdd for the first power signal terminal PVDD may be located on the third metal layer Mc and located between the film layer where the data line is located and the film layer where the gate connection structure N101 of the drive transistor DT is located, which can improve a signal crosstalk between the data line and the gate connection structure N101 of the drive transistor DT. The gate connection structure N101 of the drive transistor DT refers to a structure for connecting the second data writing transistor T5 and the gate of the drive transistor DT to realize signal transmission between the second data writing transistor T5 and the gate of the drive transistor DT. Optionally, at least part of the first power signal line may be arranged on the fourth metal layer, and the data line may be disposed on the third metal layer Mc. Part of structures of the first power signal line on the fourth metal layer can be arranged in a mesh shape to reduce a voltage drop of the first power signal line and improve a display uniformity of the display panel.

When the pixel circuit 10 in the display panel 000 is set to be a connection structure shown in FIG. 11, a corresponding circuit layout structure thereof is shown in FIG. 15. In one embodiment, to clearly illustrate the channel region of the first transistor T1, the channel region of the first transistor T1 is taken as an elongated strip as an example in FIG. 15. FIG. 15 illustrates corresponding locations of each signal line and each transistor. FIG. 15 only illustrates the layout structure of the pixel circuit corresponding to FIG. 11, which is not limited herein during specific implementation. FIG. 15 only takes the circuit layout of the two subpixels (i.e., the first subpixel 00A and the second subpixel 00B) corresponding to the display panel as an example to illustrate that the width-to-length ratios of the channel regions of the first transistors are different, which is detailed below.

As shown in FIG. 16, the first subpixel 00A includes a first transistor T1A and a light emitting element 20A. The second subpixel 00B includes a first transistor T1B and a light emitting element 20B. A width WA and a length LA of the channel region of the first transistor T1A, and a width WB and a length LB of the channel region of the first transistor T1B are shown in FIG. 16. $N1=WA/LA$, and $N2=WB/LB$. The width WA of the channel region of the first transistor T1A can be set larger than the width WB of the channel region of the first transistor T1B, the length LA of the channel region of the first transistor T1A can be set equal to the length LB of the channel region of the first transistor T1B, so that the width-to-length ratio N1 of the channel region of the first transistor T1A of the first subpixel 00A is larger than the width-to-length ratio N2 of the channel region of the first transistor T1B of the second subpixel 00B.

As shown in FIG. 16, a width of the first active part T1P of the channel region of the first transistor T1A in the first subpixel 00A in the second direction Y is set larger than a width of the first active part T1P of the channel region of the first transistor T1B in the second subpixel 00B in the second direction Y, so that the width WA of the channel region of the first transistor T1A is larger than the width WB of the channel region of the first transistor T1B, thereby realizing that the width-to-length ratio N1 of the channel region of the first transistor T1A in the first subpixel 00A is greater than the width-to-length ratio N2 of the channel region of the first transistor T1B in the second subpixel 00B.

Alternatively, as shown in FIG. 17, the first subpixel 00A includes a first transistor T1A and a light emitting element 20A, the second subpixel 00B includes a first transistor T1B and a light emitting element 20B. A width WA and a length LA of the channel region of the first transistor T1A and a width WB and a length LB of the channel region of the second transistor T1B are shown in FIG. 17. N1=WA/LA, and N2=WB/LB. The width WA of the channel region of the first transistor T1A can be set equal to the width WB of the channel region of the second transistor T1B, the length LA of the channel region of the first transistor T1A can be set smaller than the length LB of the channel region of the second transistor T1B, so that the width-to-length ratio N1 of the channel region of the first transistor T1A of the first subpixel 00A is larger than the width-to-length ratio N2 of the channel region of the first transistor T1B of the second subpixel 00B. As shown in FIG. 17, a gate width of the channel region of the first transistor T1A in the first subpixel 00A in the first direction X is set smaller than a gate width of the channel region of the first transistor T1B in the second subpixel 00B in the first direction X, so that the length LA of the channel region of the first transistor T1A is smaller than the length LB of the channel region of the first transistor T1B, thereby realizing that the width-to-length ratio N1 of the channel region of the first transistor T1A of the first sub-pixel 00A is greater than the width-to-length ratio N2 of the channel region of the first transistor T1B of the second sub-pixel 00B.

FIG. 16 and FIG. 17 only exemplarily illustrate the structure of changing the width-length ratio of the channel region of the first transistor T1, which is not limited herein. During specific implementation, the width-length ratio of the channel region of the first transistor T1 may also be changed by other means, which can be set according to actual needs.

Figure 18:
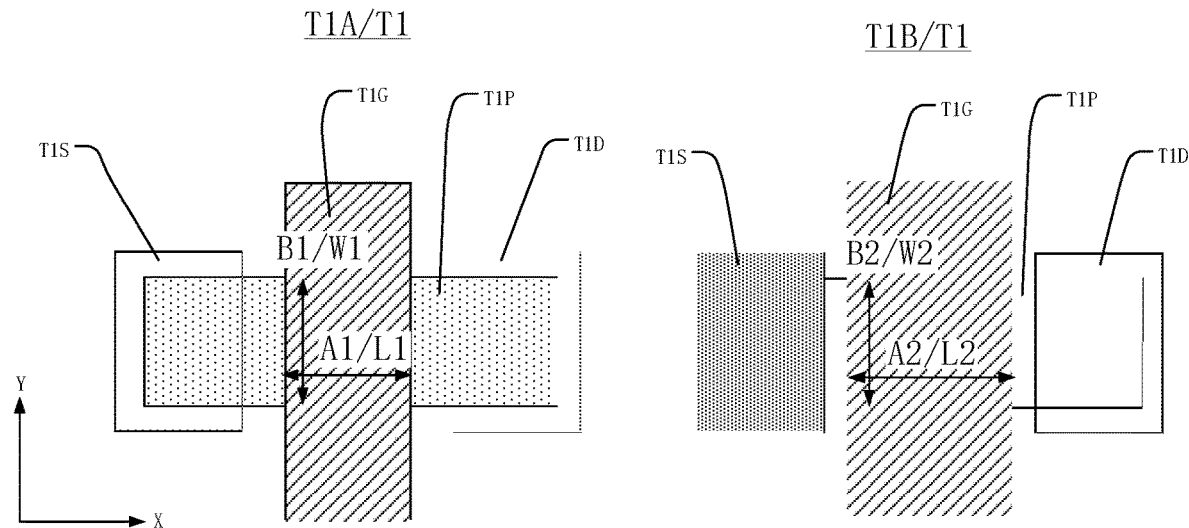
FIG. 18 illustrates a comparison diagram of a first transistor in a first subpixel and a first transistor in a second subpixel in FIG. 15.
Figure 19:
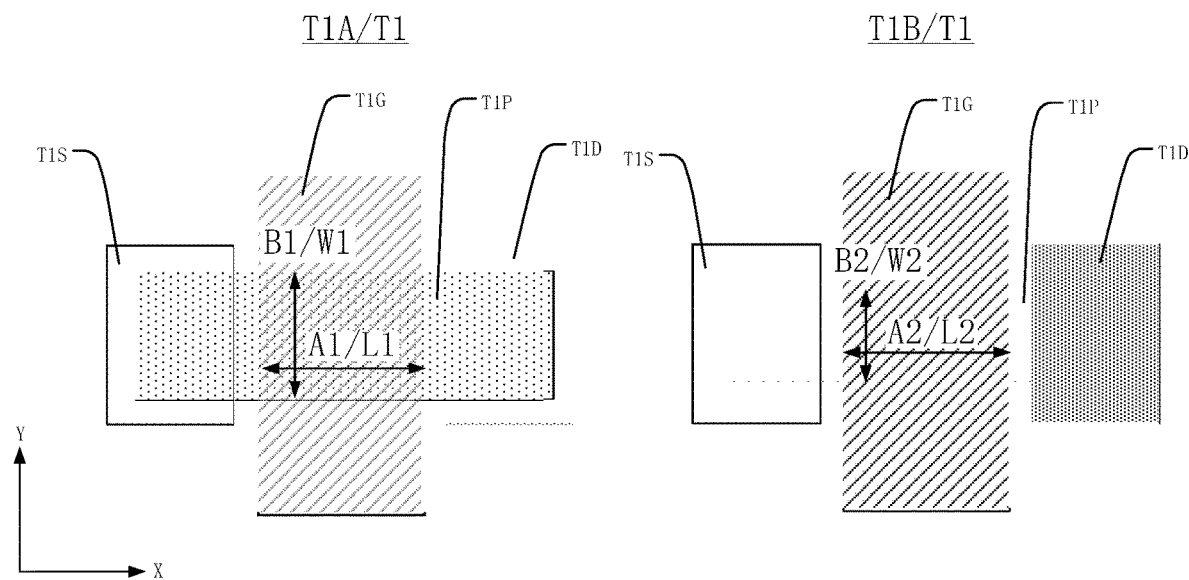
FIG. 19 illustrates another comparison diagram of a first transistor in a first subpixel and a first transistor in a second subpixel in FIG. 15.

In some optional embodiments, referring to FIG. 1, FIG. 11, FIG. 15, FIG. 18 and FIG. 19, FIG. 18 illustrates a comparison diagram of a first transistors in a first subpixel and a second subpixel in FIG. 15, and FIG. 19 illustrates another comparison diagram of a first transistors in a first subpixel and a second subpixel in FIG. 15. In one embodiment, a width of the channel region of the first transistor T1A in the first subpixel 00A is W1, and a width of the channel region of the first transistor T1B in the second subpixel 00B is W2. A length of the channel region of the first transistor T1A in the first subpixel 00A is L1, and a length of the channel region of the first transistor T1B in the second subpixel 00B is L2. If W1=W2, L1<L2, or, if L1=L2, W1>W2.

The embodiment explains a structure of changing the width-length ratio of the channel region of the first transistor T1. As shown in FIG. 18, the width W1 of the channel region of the first transistor T1A in the first subpixel 00A can be set equal to the width W2 of the channel region of the first transistor T1 in the second subpixel 00B, that is, W1=W2, so that the length L1 of the channel region of the first transistor T1A in the first subpixel 00A is smaller than the length L2 of the channel region of the first transistor T1B in the second subpixel 00B, that is, L1<L2. Alternatively, as shown in FIG. 19, the length L1 of the channel region of the first transistor T1A in the first subpixel 00A can also be set equal to the length L2 of the channel region of the first transistor T1B in the second subpixel 00B, that is, L1=L2, so that the width W1 of the channel region of the first transistor T1A in the first subpixel 00A is greater than the width W2 of the channel region of the first transistor T1 in the second subpixel 00B, that is, W1>W2, thereby realizing that the width-to-length ratio N1 of the channel region of the first transistor T1A in the first subpixel 00A is greater than the width-to-length ratio N2 of the channel region of the first transistor T1B in the second subpixel 00B, so that width-to-length ratios of the channel regions of the first transistors T1 connected to the light-emitting elements 20 of different colors in the display panel 000 are different to balance display effects of the sub-pixels of different colors, thereby avoiding color shifts of the light emitting elements 20 of different colors at a low grayscale, and improving a display effect of the display panel 000.

In some optional embodiments, referring to FIG. 1, FIG. 11, FIG. 15, FIG. 18 and FIG. 19, in one embodiment, along the first direction X, a length of the first gate T1G of the first transistor T1A in the first subpixel 00A is A1 and a length of the first gate T1G of the first transistor T1B in the second subpixel 00B is A2. Along the second direction Y, a length of the first active part T1P of the first transistor T1A in the first subpixel 00A is B1, and a length of the first active part T1P of the first transistor T1B in the second subpixel 00B is B2. If A1=A2, B1>B2, or, if B1=B2, A1<A2.

The embodiment explains that, as shown in FIG. 19, a structure can increase a width W of the channel region of the first transistor T1 by increasing the length B1 of the first active part T1P of the first transistor T1A in the first subpixel 00A in the second direction Y. That is, in the first direction X, the length A1 of the first gate T1G of the first transistor T1A in the first subpixel 00A is equal to the length A2 of the first gate T1G of the first transistor T1B in the second subpixel 00B, so that in the second directions Y, the length B1 of the first active part T1P of the first transistor T1A in the first subpixel 00A is greater than the length B2 of the first active part T1P of the first transistor T1B in the second subpixel 00B, which is equivalent to increasing the width W1 of the channel region of the first transistor T1A in the first subpixel 00A, thereby realizing that the width-to-length ratio N1 of the channel region of the first transistor T1A in the first subpixel 00A is greater than the width-to-length ratio N2 of the channel region of the first transistor T1B in the second subpixel 00B.

As shown in FIG. 18, a structure can reduce a length L of the channel region of the first transistor T1 by reducing the length A1 of the first gate T1G of the first transistor T1A in the first subpixel 00A in the first direction X. That is, in the second direction Y, the length B1 of the first active part T1P of the first transistor T1A is equal to the length B2 of the first active part T1P of the first transistor T1B in the second subpixel 00B, so that in the first direction X, the length A1 of the first gate T1G of the first transistor T1A in the first subpixel 00A is smaller than the length A2 of the first gate T1G of the first transistor T1B in the second subpixel 00B, which is equivalent to reducing the length L1 of the channel region of the first transistor T1A in the first subpixel 00A, thereby realizing that the width-to-length ratio N1 of the channel region of the first transistor T1A in the first subpixel 00A is greater than the width-to-length ratio N2 of the channel region of the first transistor T1B in the second subpixel 00B.

Figure 20:
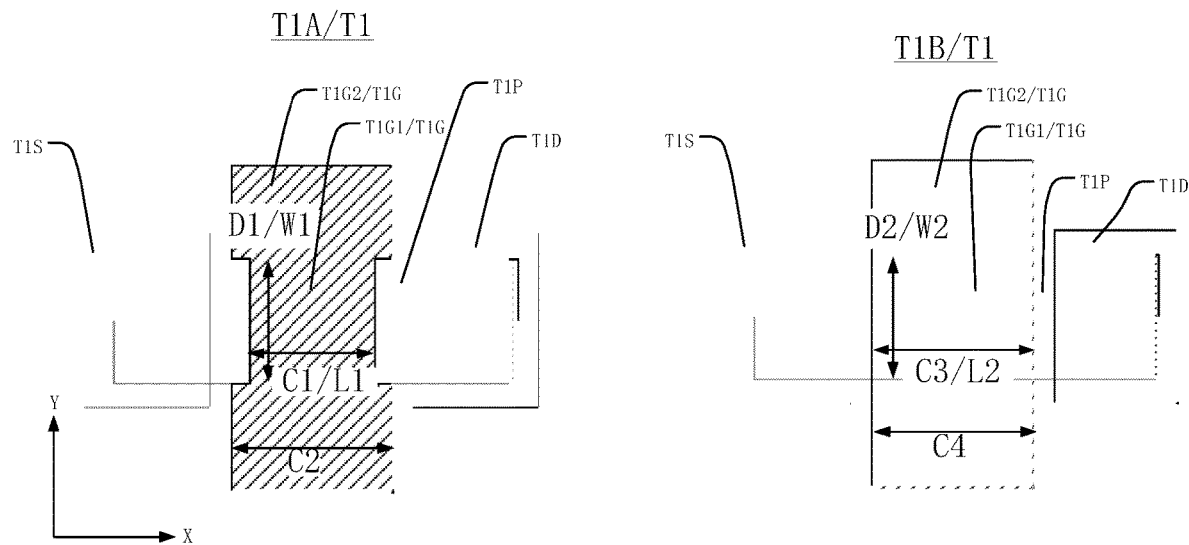
FIG. 20 illustrates another comparison diagram of a first transistor in a first subpixel and a first transistor in a second subpixel in FIG. 15.
Figure 21:
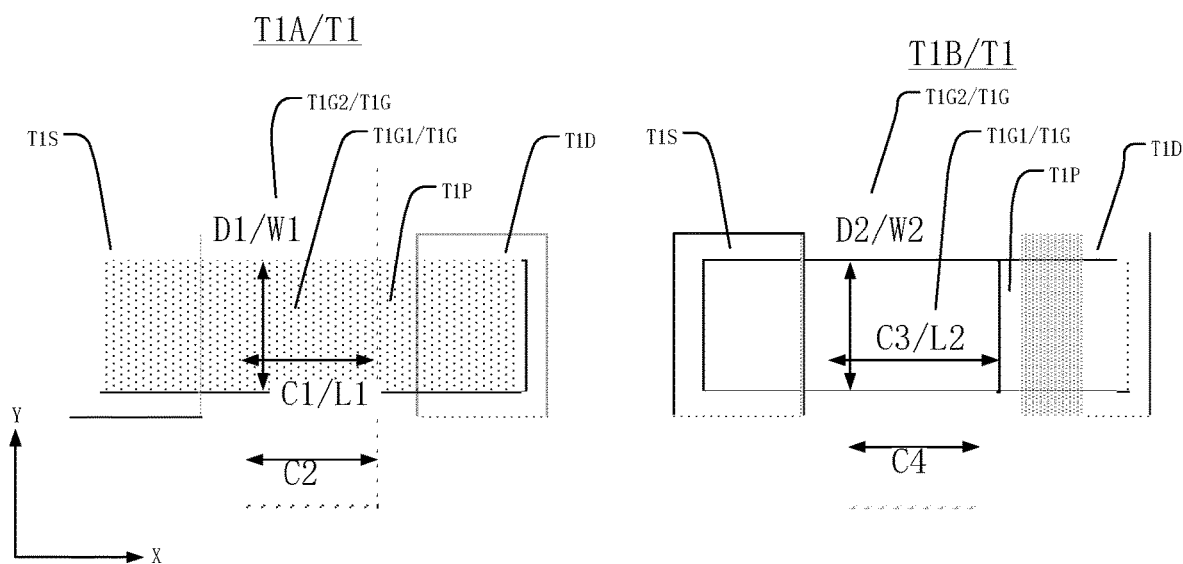
FIG. 21 illustrates another comparison diagram of a first transistor in a first subpixel and a first transistor in a second subpixel in FIG. 15.

In some optional embodiments, referring to FIG. 1, FIG. 11, FIG. 15, FIG. 20 and FIG. 21, FIG. 20 illustrates another comparison diagram of a first transistors in a first subpixel and a second subpixel in FIG. 15, and FIG. 21 illustrates another comparison diagram of a first transistors in a first subpixel and a second subpixel in FIG. 15. In one embodiment, the first gate T1G includes a first subsection T1G1 and a second subsection T1G2. In a direction perpendicular to a light emitting surface of the display panel 000, the first subsection T1G1 overlaps the first active part T1P, and the second subsection T1G2 does not overlap the first active part T1P. That is, the channel region T1C of the first transistor T1 refers to a region where the first subsection T1G1 overlaps the first active part T1P.

Along the first direction X, in the first subpixel 00A, a length of the first subsection T1G1 of the first gate T1G of the first transistor T1A is C1, and a length of the second subsection T1G2 of the first gate T1G of the first transistor T1A is C2, in the second subpixel 00B, a length of a first subsection T1G1 of the first gate T1G of the first transistor T1B is C3, and a length of the second subsection T1G2 of the first gate T1G of the first transistor T1B is C4. Along the second direction Y, in the first subpixel 00A, a length of the first active part T1P of the first transistor T1A is D1, and in the second subpixel 00B, a length of the first active part T1P of the first transistor T1B is D2. If D1=D2, C2=C4, then C1<C3.

The embodiment explains that the channel regions of the first transistors T1 corresponding to different colors can have different width-to-length ratios by designing first gates of the first transistors corresponding to the two light emitting elements 20 of different colors with different shapes.

As shown in FIG. 20, along the first direction X, in the first subpixel 00A, the length of the first subsection T1G1 of the first gate T1G of the first transistor T1A is C1, the length of the second subsection T1G2 is C2, and C1<C2. That is, the first gate T1G of the first transistor T1A includes two subsections with different widths. The length C1 of the first subsection T1G1 overlapping the first active part T1P along the first direction X is relatively small. In the second subpixel 00B, the length C3 of the first subsection T1G1 of the first gate T1G of the first transistor T1B may be equal to the length C4 of the second subsection T1G2 of the first gate T1G of the first transistor T1B. That is, the first gate T1G of the first transistor T1B does not have a special shape design and is still a long structure. In the second direction Y, when the length D1 of the first active part T1P of the first transistor T1A in the first subpixel 00A is equal to the length D2 of the first active part T1P of the first transistor T1B in the second subpixel 00B, that is, when D1=D2, and along the first direction X, when the length C2 of the second subsection T1G2 of the first gate T1G of the first transistor T1A is still equal to the length C4 of the second subsection T1G2 of the first gate T1G of the first transistor T1B, that is, when C2=C4, along the first direction X, the length C1 of the first subsection T1G1 of the first gate T1G of the first transistor T1A is smaller than the length C3 of the first subsection T1G1 of the first gate T1G of the first transistor T1B, which is equivalent to reducing the length L1 of the channel region of the first transistor T1A by designing different shapes of the first gate T1G of the first transistor T1A, thereby increasing the width-to-length ratio of the channel region of the first transistor T1A in the first sub-pixel 00A and realizing that the width-to-length ratio N1 of the channel region of the first transistor T1A in the first subpixel 00A is greater than the width-to-length ratio N2 of the channel region of the first transistor T1B in the second subpixel 00B.

As shown in FIG. 21, along the first direction X, in the second subpixel 00B, the length of the first subsection T1G1 of the first gate T1G of the first transistor T1B is C3, the length of the second subsection T1G2 is C4, and C3>C4. That is, the first gate T1G of the first transistor T1B includes two subsections with different widths. The length C3 of the first subsection T1G1 overlapping the first active part T1P along the first direction X is relatively large. In the first subpixel 00A, the length C1 of the first subsection T1G1 of the first gate T1G of the first transistor T1A may be equal to the length C2 of the second subsection T1G2. That is, the first gate T1G of the first transistor T1A does not have a special shape design and is still a long structure. Along the second direction Y, when the length D1 of the first active part T1P of the first transistor T1A in the first subpixel 00A is equal to the length D2 of the first active part T1P of the first transistor T1B in the second subpixel 00B, that is, when D1=D2, and along the first direction X, when the length C2 of the second subsection T1G2 of the first gate T1G of the first transistor T1A is still equal to the length C4 of the second subsection T1G2 of the first gate T1G of the first transistor T1B, that is, when C2=C4, along the first direction X, the length C1 of the first subsection T1G1 of the first gate T1G of the first transistor T1A is smaller than the length C3 of the first subsection T1G1 of the first gate T1G of the first transistor T1B, which is equivalent to increasing the length L2 of the channel region of the first transistor T1B by designing different shapes of the first gate T1G of the first transistor T1B, thereby reducing the width-to-length ratio of the channel region of the first transistor T1B in the second subpixel 00B, and realizing that the width-to-length ratio N1 of the channel region of the first transistor T1A in the first subpixel 00A is greater than the width-to-length ratio N2 of the channel region of the first transistor T1B in the second subpixel 00B.

Figure 22:
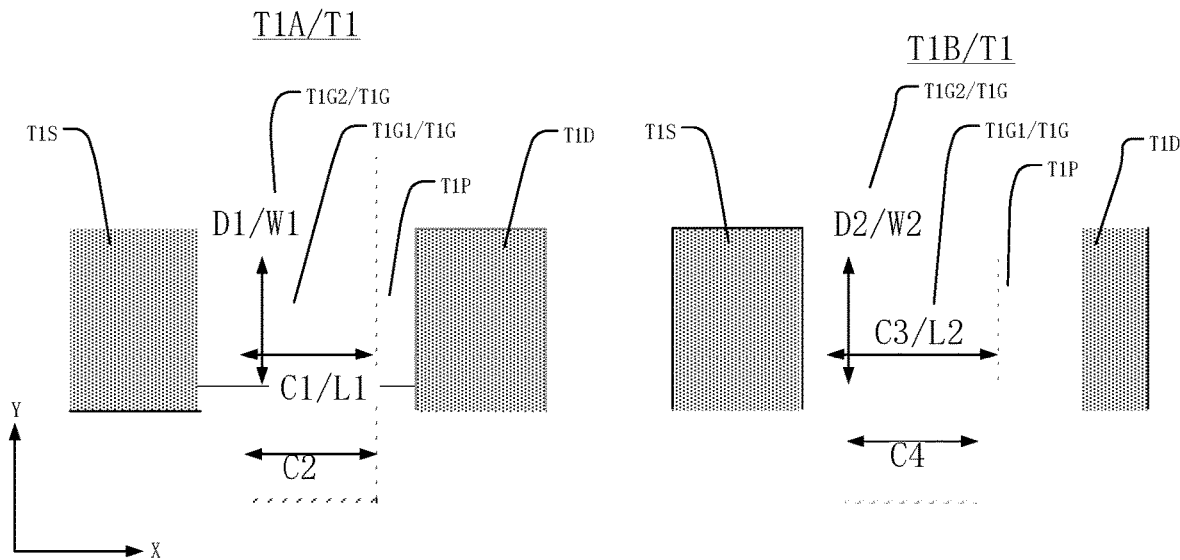
FIG. 22 illustrates another comparison diagram of a first transistor in a first subpixel and a first transistor in a second subpixel in FIG. 15.
Figure 23:
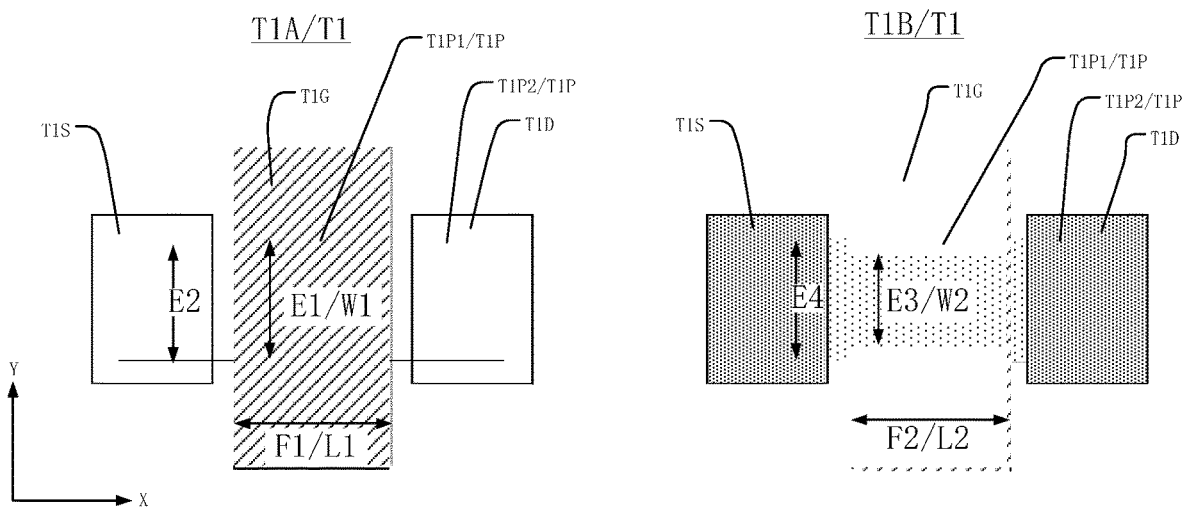
FIG. 23 illustrates another comparison diagram of a first transistor in a first subpixel and a first transistor in a second subpixel in FIG. 15.

In some optional embodiments, referring to FIG. 1, FIG. 11, FIG. 15, FIG. 22 and FIG. 23, FIG. 22 illustrates another comparison diagram of a first transistors in a first subpixel and a second subpixel in FIG. 15, and FIG. 23 illustrates another comparison diagram of a first transistors in a first subpixel and a second subpixel in FIG. 15. In one embodiment, the first active part T1P of the first transistor T1 includes a third subsection T1P1 and a fourth subsection T1P2. In a direction perpendicular to a light emitting surface of the display panel 000, the third subsection T1P1 overlaps the first gate T1G, and the fourth subsection T1P2 does not overlap the first gate T1G. That is, the channel region T1C of the first transistor T1 refers to a region where the third subsection T1P1 overlaps the first gate T1G.

Along the second direction Y, in the first subpixel 00A, a length of the third subsection T1P1 of the first active part T1P of the first transistor T1A is E1, and a length of the fourth subsection T1P2 of the first active part T1P of the first transistor T1A is E2. In the second subpixel 00B, a length of the third subsection T1P1 of the first active part T1P of the first transistor T1B is E3, and a length of the fourth subsection T1P2 of the first active part T1P of the first transistor T1B is E4. Along the first direction X, a length of the first gate T1G of the first transistor T1A in the first subpixel 00A is F1, and a length of the first gate T1G of the first transistor T1B in the second subpixel 00B is F2. If F1=F2, and E2=E4, E1>E3.

The embodiment explains that the width-to-length ratio of the channel region of the first transistor T1 corresponding to different colors can be realized by making some different shape designs for the first active parts of the first transistors corresponding to the two light emitting elements 20 of different colors.

As shown in FIG. 22, along the second direction Y, in the first subpixel 00A, the length of the third subsection T1P1 of the first active part T1P of the first transistor T1A is E1, and the length of the fourth subsection T1P2 is E2, and E1>E2. That is, the first active part T1P of the first transistor T1A includes two sections with different widths. The length E1 of the third subsection T1P1 overlapping the first gate T1G along the second direction Y is relatively large. In the second subpixel 00B, the length E3 of the third subsection T1P of the first active part T1P of the first transistor T1B may be equal to the length E4 of the fourth subsection T1P2. That is, the first active part T1P of the first transistor T1B has no special shape design and is still a long strip structure. Along the first direction X, when the length F1 of the first gate T1G of the first transistor T1A in the first subpixel 00A is equal to the length F2 of the first gate T1G of the first transistor T1B in the second subpixel 00B, that is, when F1=F2, and along the second direction Y, when the length E2 of the fourth subsection T1P2 of the first active part T1P of the first transistor T1A is still equal to the length E4 of the fourth subsection T1P2 of the first active part T1P of the first transistor T1B, that is, when E2=E4, along the second direction X, the length E1 of the third subsection T1P1 of the first active part T1P of the first transistor T1A is greater than the length E3 of the third subsection T1P1 of the first active part T1P of the first transistor T1B, which is equivalent to increasing the width W1 of the channel region of the first transistor T1A by designing different shapes of the first active part T1P of the first transistor T1A, thereby increasing the width-to-length ratio of the channel region of the first transistor T1A in the first subpixel 00A and realizing that the width-to-length ratio N1 of the channel region of the first transistor T1A in the first subpixel 00A is greater than the width-to-length ratio N2 of the channel region of the first transistor T1B in the second subpixel 00B.

As shown in FIG. 23, along the second direction Y, in the second subpixel 00B, the length of the third subsection T1P1 of the first active part T1P of the first transistor T1B is E3, and the length of the fourth subsection T1P2 of the first active part T1P of the first transistor T1B is E4, and E3<E4. That is, the first active part T1P of the first transistor T1B includes two subsections with different widths. The length E3 of the third subsection T1P1 overlapping the first gate T1G along the second direction Y is relatively small. In the first subpixel 00A, the length E1 of the third sub-portion T1P1 of the first active part T1P of the first transistor T1A may be equal to the length E2 of the fourth sub-portion T1P2. That is, the first active part T1P of the first transistor T1A has no special shape design and is still a long strip structure.

Along the first direction X, when the length F1 of the first gate T1G of the first transistor T1A in the first subpixel 00A is equal to the length F2 of the first gate T1G of the first transistor T1B in the second subpixel 00B, that is, when F1=F2, and along the second direction Y, when the length E2 of the fourth subsection T1P2 of the first active part T1P of the first transistor T1A is still equal to the length E4 of the fourth subsection T1P2 of the first active part T1P of the first transistor T1B, that is, when E2=E4, along the second direction X, the length E1 of the third subsection T1P1 of the first active part T1P of the first transistor T1A is greater than the length E3 of the third subsection T1P1 of the first active part T1P of the first transistor T1B, which is equivalent to reducing the width W2 of the channel region of the first transistor T1B by designing different shapes of the first active part T1P of the first transistor T1B, thereby reducing the first transistor T1B in the second subpixel 00B and realizing the width-to-length ratio N1 of the channel region of the first subpixel 00A is greater than the width-to-length ratio N2 of the channel region of the first transistor T1B in the second subpixel 00B.

In the embodiment, only a shape of the channel region of the first transistor T1 is taken as a rectangle as an example to illustrate a width and a length of the channel region. The shape of the channel region may also include other shapes, which may be understood with reference to other shapes in a related art and are not limited herein.

FIGS. 18 to 23 are only illustrative of several implementations that make width-to-length ratios of the channel regions of the first transistors T1 connected to the light emitting elements 20 of different colors in the display panel 000 different. During specific implementation, a structure of the first transistor T1 can also be another structure that can change the width-to-length ratio of the channel region of the first transistor T1, which is not limited herein.

Optionally, in one embodiment, referring to FIGS. 1-4 and FIG. 15, the length L of the channel region T1C of the first transistor T1 is less than or equal to 3.5 μm, and the width W of the channel region T1C of the first transistor T1 is less than or equal to 3 μm. Optionally, the width W of the channel region T1C of the first transistor T1 is equal to 2 μm. The embodiment explains that the length L of the channel region T1C of the first transistor T1 in the pixel circuit 10 is generally set less than or equal to 3.5 μm, and the width W of the channel region T1C of the first transistor T1 is set less than or equal to 3 μm to consider an entire layout space of the display panel 000 and prevent transistors in the display panel from occupying too much space to affect a transmittance. In the pixel circuit 10, the length L of the channel region T1C of the first transistor T1 is generally set less than or equal to 3.5 μm, and the width W of the channel region T1C of the first transistor T1 is generally set less than or equal to 3 μm. For example, the width W of the channel region T1C of the first transistor T1 is 2 μm, the length L of the channel region T1C of the first transistor T1A in the first subpixel 00A can be 2.7 μm, and the length L of the channel region T1C of the first transistor T1A in the first subpixel 00A may be 2.7 μm, and the second subpixel 00B The length L of the channel region T1C of a transistor T1B may be 3 μm, thereby realizing that the width-to-length ratio N1 of the channel region of the first transistor T1A in the first subpixel 00A is greater than the width-length ratio N2 of the channel region of the first transistor T1B in the second subpixel 00B, which is conducive to ensuring a transmittance of the display panel and improving a display effect.

Figure 24:
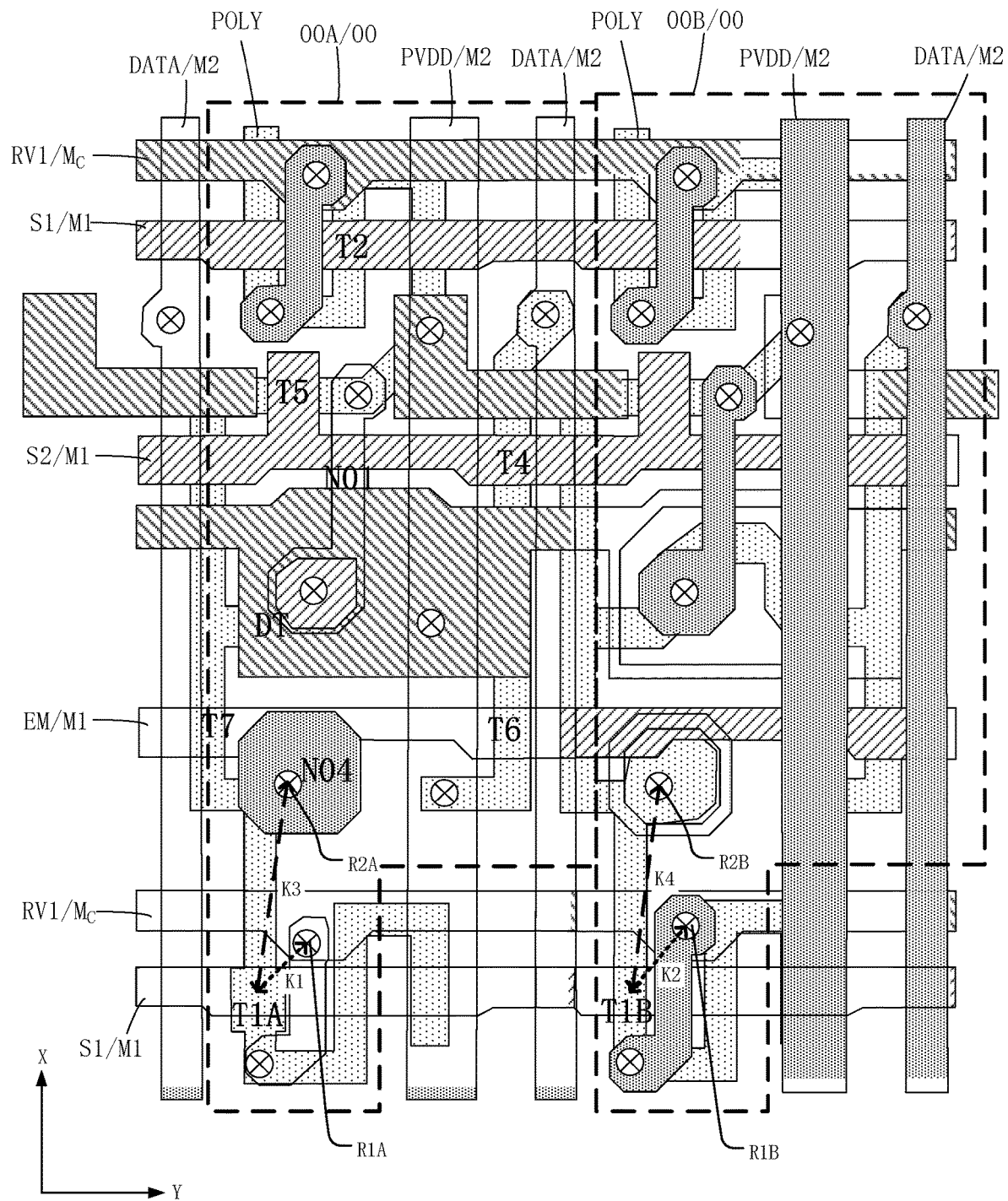
FIG. 24 illustrates another circuit layout when a circuit structure in FIG. 11 is formed on a display panel.
Figure 25:
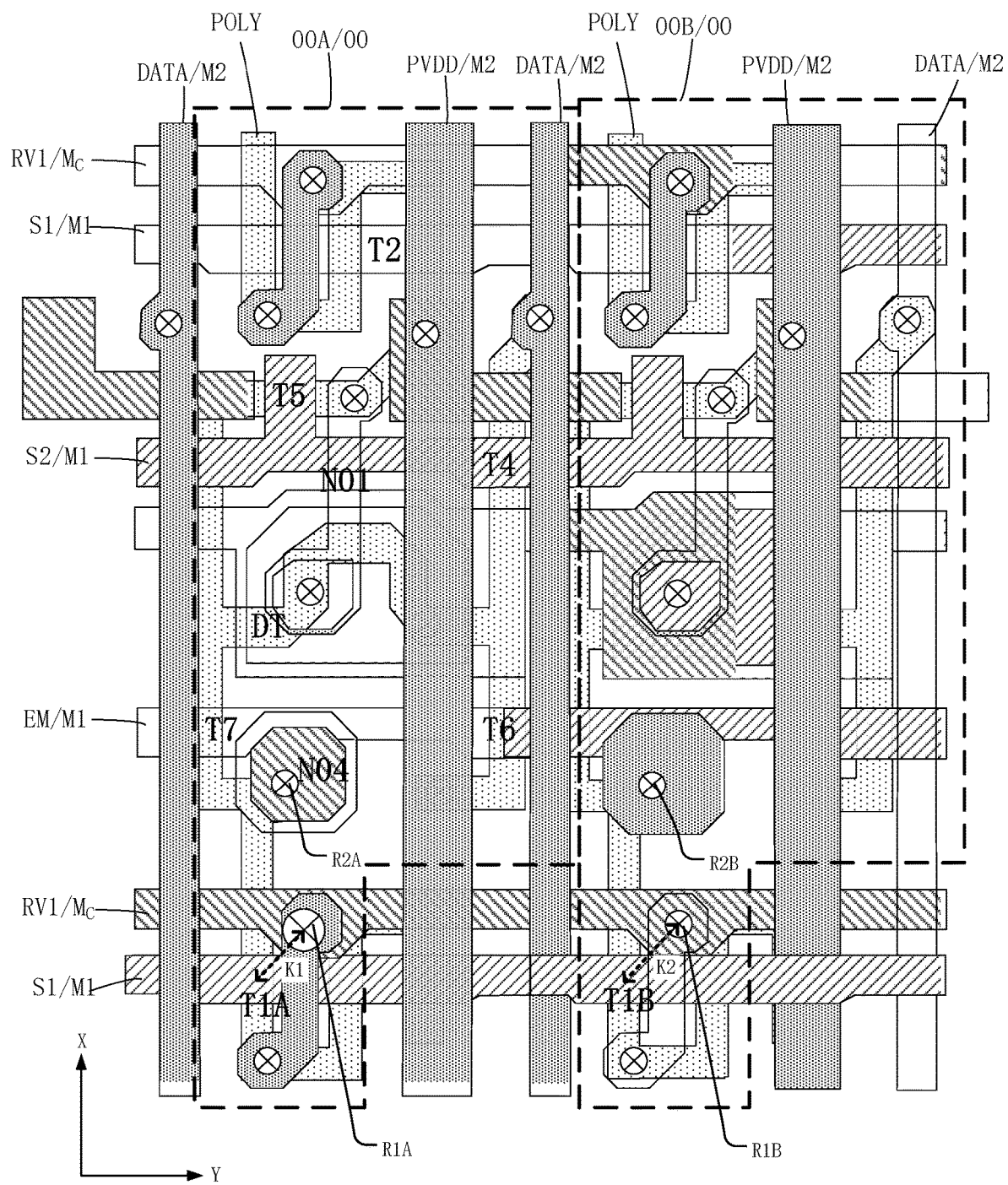
FIG. 25 illustrates another circuit layout when a circuit structure in FIG. 11 is formed on a display panel.

In some optional embodiments, referring to FIG. 1, FIG. 4, FIG. 11, FIG. 15, FIG. 24, and FIG. 25, FIG. 24 illustrates another circuit layout when a circuit structure in FIG. 11 is formed on a display panel, and FIG. 25 illustrates another circuit layout when a circuit structure in FIG. 11 is formed on a display panel. In one embodiment, the first subpixel 00A includes a first via hole R1A and at least one second via hole R2A. In a direction parallel to a light emitting surface of the display panel 000, a distance K1 from the first via hole R1A to the channel region of the first transistor T1A is smaller than a distance K3 from the second via hole R2A to the channel region of the first transistor T1A. The second subpixel 00B includes a third via hole R1B and at least one fourth via hole R2B. In a direction parallel to a light emitting surface of the display panel 000, a distance K2 from the third via hole R1B to the channel region of the first transistor T1B is smaller than a distance K4 from the fourth via hole R2B to the channel region of the first transistor T1B, and K1<K2.

The embodiment explains that when different conductive film layers in the display panel 000 are used to form a pixel circuit structure, it is often necessary to electrically connect structures of the different conductive film layers that are insulated from each other to realize a signal transmission. As shown in FIG. 11 and FIG. 15, the first source T1S of the first transistor T1 is connected to the first reference voltage signal terminal RV1 and is on the second metal layer M2. A first reference voltage signal line where the first reference voltage signal terminal RV1 is located is on the third metal layer Mc. To achieve an electrical connection between the first source T1S of the first transistor T1 and the first reference voltage signal line, it is necessary to provide via holes R penetrating an insulating layer between the second metal layer M2 and the third metal layer MC. It can be understood that the pixel circuit 10 of one subpixel 00 needs to include a plurality of via holes R.

Since hydrogen ions existing at an interface between a gate insulating layer and an active part are likely to evaporate through the via holes in a forming process of the via holes, by adjusting distances from the via holes in different subpixels 00 to the channel region of the first transistor T1, characteristics of the first transistor can be adjusted. The more the hydrogen ions are evaporated, the worse a turn-on or cut-off performance of the first transistor T1. The less the hydrogen ions are evaporated, the better a turn-on or cut-off performance of the first transistor T1.

In one embodiment, the first subpixel 00A includes a first via hole R1A and at least one second via hole R2A. In a direction parallel to a light emitting surface of the display panel 000, the distance K1 from the first via hole R1A to the channel region of the first transistor T1A is smaller than the distance K3 from the second via hole R2A to the channel region of the first transistor T1A. That is, the first via hole R1A is a via hole closest to the channel region of the first transistor T1A. Number of second via holes R2A may be one, two or more. Compared with any other second via hole R2A in the first subpixel 00A, a distance from the first via hole R1A to the channel region of the first transistor T1A is closest. Similarly, the second subpixel 00B includes a third via hole R1B and at least one fourth via hole R2B. In a direction parallel to a light emitting surface of the display panel 000, the distance K2 from the third via hole R1B to the channel region of the first transistor T1B is smaller than the distance K4 from the fourth via hole R2B to the channel region of the first transistor T1B. That is, the third via hole R1B is a via hole closest to the channel region of the first transistor T1B. Number of fourth via holes R2B may be one, two or more. Compared with any other fourth via hole R2B in the second subpixel 00B, a distance from the third via hole R1B to the channel region of the first transistor T1B is closest. Optionally, as shown in FIGS. 15 and 24, the first via hole R1A is a via hole connecting a first source electrode of the first transistor T1A on the second metal layer M2 and the first reference voltage signal line on the third metal layer Mc in the first subpixel 00A. The third via hole R1B is a via hole connecting a first source electrode of the first transistor T1B on the second metal layer M2 and the first reference voltage signal line on the third metal layer Mc in the second subpixel 00B. That is, via holes closest to the channel region of the first transistor T1 in different subpixels may be via holes that realizes a same function. Alternatively, in some other embodiments, the via holes closest to the channel region of the first transistor T1 in different subpixels can also be via holes of different types if the first via hole R1A is a via hole closest to the channel region of the first transistor T1A, and the third via hole R1B is a via hole closest to the channel region of the first transistor T1B. A distance from a channel region to a via hole may be a distance from an edge location of the channel region closest to the via hole to an edge location of the via hole closest to the channel region in a direction parallel to a light emitting surface of the display panel 000, or a distance between a geometric center of the channel region and a geometric center of the via hole in a direction parallel to a light emitting surface of the display panel 000 (shown in FIG. 24) when both the channel region and the via hole are geometric images.

The embodiment only exemplarily illustrates the first via hole R1A closest to the first transistor T1A and the third via hole R1B closest to the first transistor T1B in the circuit layout. During specific implementation, as shown in FIG. 15, FIG. 24, and FIG. 25, a designed layout range of the first subpixel 00A and the second subpixel 00B may further include first transistors in the subpixels in a previous row. The transistors can also be designed with different distances between via holes and channel regions of the transistors, so that performances of first subpixels in the previous row are changed.

In a direction parallel to a light emitting surface of the display panel 000, the distance K1 from the first via hole R1A in the first subpixel 00A to the channel region of the first transistor T1A is smaller than the distance K2 from the third via hole R1B in the second subpixel 00B to the channel region of the first transistor T1B, so that via holes exist within a relatively short range of the channel region of the first transistor T1A, thereby accelerating an evaporation of hydrogen ions in the first transistor T1A in the first subpixel 00A, increasing an evaporation amount of hydrogen ions in the first transistor T1A in the first subpixel 00A, and reducing a turn-on or turn-off performance of the first transistor T1A in the first sub-pixel 00A. Therefore, a brightness fluctuation of the light emitting element 20A in the first subpixel 00A at a low grayscale can be reduced and achieves a same brightness fluctuation of the light emitting element 20B in the second subpixel 00B as far as possible. Eventually, brightness fluctuations of the light emitting elements 20 of different colors under environmental changes are balanced as far as possible, so that the light emitting elements 20 of different colors emit light normally at a low grayscale, color shifts are avoided, and white images at a low grayscale are displayed normally. which is conducive to improving a display effect of the display panel 000 at a low grayscale.

FIG. 24 only illustrates that characteristics of a transistor can be adjusted by changing a location of the via hole closest to the channel region of the first transistor T1 in the sub-pixel 00. During specific implementation, the characteristics of the transistor can be adjusted by increasing number of via holes surrounding the first transistor T1A in the first subpixel 00A (not shown). The characteristics of the transistor can be adjusted by increasing an aperture Q1 of the first via hole R1A. That is, the aperture Q1 of the first via hole R1A is made larger than an aperture Q2 of the third via hole R1B, so that an edge of the first via hole R1A is moved closer to the channel region of the first transistor T1A, to realize a reduction of the distance K1 from the first via hole R1A to the channel region of the first transistor T1A (shown in FIG. 25). An evaporation amount of hydrogen ions may be increased by adding virtual via holes around the first transistor T1A in the first subpixel 00A or by another implementation. During specific implementation, other implementations may also be used according to actual needs, which is not described in detail herein.

The embodiment only uses the circuit layout of FIG. 15 as an example to illustrate the via hole closest to the first transistor T1 among via holes around the first transistor T1. During specific implementation, the via hole can be designed according to an actual circuit layout, which is not described in detail herein.

Figure 26:
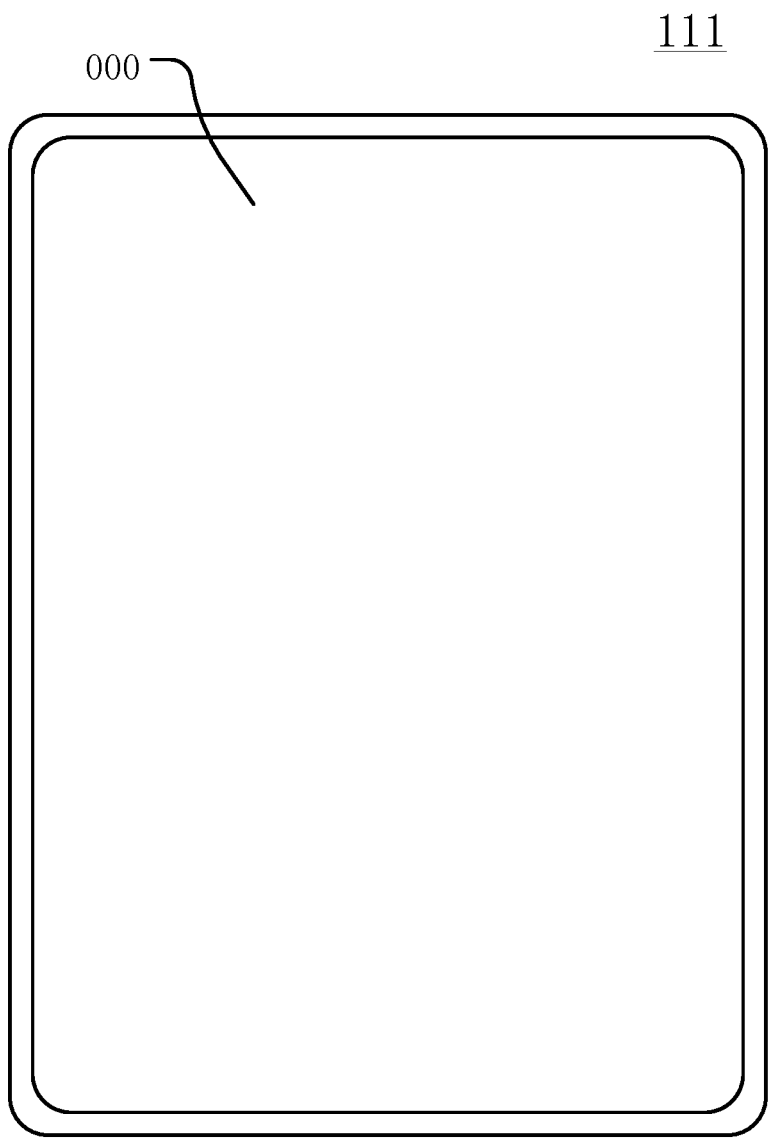
FIG. 26 illustrates a schematic diagram of a display device consistent with various embodiments of the present disclosure.

In some optional embodiments, referring to FIG. 26, FIG. 26 illustrates a schematic diagram of a display device consistent with various embodiments of the present disclosure. In one embodiment, a display device 111 includes a display panel 000 provided in any of the above embodiments. FIG. 26 only takes a mobile phone as an example to describe the display device 111. The display device 111 may be another display device 111 having a display function, such as a computer, a TV, and a vehicle-mounted display device, which is not specifically limited herein. The display device 111 has beneficial effects of the display panel 000. For details, reference may be made to specific descriptions of the display panel 000 in the above embodiments, which is not repeated herein.

As can be seen from the above embodiments, the display panel and the display device provided by the present disclosure at least achieve the following beneficial effects.

In the display panel and the display device provided by the present disclosure, the width-to-length ratio of the channel region of the first transistor in the first subpixel is greater than the width-to-length ratio of the channel region of the first transistor in the second subpixel, so that the leakage current of the first transistor in the first subpixel is greater than the leakage current of the first transistor in the second subpixel. Therefore, when the light emitting element in the first subpixel emits light at a low grayscale, compared with the second subpixel, a relatively large current leaks from the first transistor in the first sub-pixel, so that the luminous efficiency of the light-emitting element in the first sub-pixel is reduced, which is conducive to enhancing a brightness stability of the light emitting element in the first subpixel. If the luminous efficiency of the light emitting element in the first subpixel is originally greater than the luminous efficiency of the light emitting element in the second subpixel, the width-to-length ratio of the channel region of the first transistor in the first subpixel is set greater than the width-to-length ratio of the channel region of the first transistor in the second subpixel, so that the luminous efficiency of the light emitting element in the first subpixel decreased and is consistent or substantially consistent with the luminous efficiency of the light emitting element in the second subpixel as far as possible. That is, a brightness fluctuation of the light emitting element in the first subpixel decreases at a low grayscale, so that a brightness increase of the light emitting element in the first subpixel decreases and achieves a same brightness increase as the light emitting element in the second subpixel as far as possible. Eventually, brightness fluctuations of light emitting elements of different colors under environmental changes are as balanced as possible, so that the light emitting elements of different colors can emit light normally at a low grayscale, color shifts are avoided, and white images at a low grayscale are displayed normally, which is conducive to improving a display effect of the display panel 000 at a low grayscale. In addition, the width-to-length ratio of the channel region of the first transistor in the first subpixel with a small turn-on voltage is set greater than the width-to-length ratio of the channel region of the first transistor in the second subpixel with a large turn-on voltage. Since the greater a width-to-length ratio of a channel region of a transistor, the greater a leakage current of the transistor, when the light emitting element in the second subpixel is turned on and carriers migrate to the light emitting element in the first subpixel, a leakage current can be drained through a strong leakage current performance of the first transistor in the first sub-pixel when the first transistor in the first subpixel is turned off, to prevent the light emitting element in the first subpixel from stealing light, which is conducive to improving a display effect. By setting different width-to-length ratios of the channel regions of the first transistors connected to anodes of the light emitting elements of different colors in the display panel to balance display effects of the subpixels of different colors, a situation that subpixels of some colors steal light when subpixels of other colors emit light is avoided, color shifts of light emitting elements of different colors at a low grayscales can also be avoided, thereby improving a display effect of the display panel at a low grayscale without affecting a circuit structure and an overall performance of the display panel.

Although some specific embodiments of the present disclosure have been described in detail by way of examples, a person skilled in the art should understand that the above examples are provided for illustration only and not for the purpose of limiting the scope of the present disclosure. A person skilled in the art should understand that various modifications may be made to the above embodiments without departing from the scope and spirit of the present disclosure. The scope of the present disclosure is defined by the appended claims.

What is claimed is:

1. A display panel, comprising a plurality of subpixels, wherein:
   a subpixel of the plurality of subpixels comprises a pixel circuit and a light emitting element that are electrically connected, the pixel circuit comprises a first transistor, a first electrode of the first transistor is connected to a first reference voltage signal terminal, and a second electrode of the first transistor is electrically connected to an anode of the light emitting element;
   in a light emitting retention stage of the subpixel of the plurality of subpixels, the first reference voltage signal terminal is connected to a negative potential signal or a ground potential signal;
   the plurality of subpixels comprises at least a first subpixel and a second subpixel, and a color of the first subpixel is different from a color of the second subpixel; and
   a width-to-length ratio of a channel region of the first transistor in the first subpixel is N1, a width-to-length ratio of a channel region of the first transistor in the second subpixel is N2, and N1>N2.

2. The display panel according to claim 1, wherein at a first grayscale, a luminous efficiency of a light emitting element in the first subpixel is greater than a luminous efficiency of a light emitting element in the second subpixel, a grayscale value of the first grayscale is Gray, and 5≤Gray≤65.

3. The display panel according to claim 1, wherein the pixel circuit further comprises a reset transistor, a first electrode of the reset transistor is connected to the anode of the light emitting element, and a second electrode of the reset transistor is connected to a reset signal terminal.

4. The display panel according to claim 3, wherein the pixel circuit further comprises a drive transistor, the second electrode of the first transistor is connected to a drain of the drive transistor, and the drain of the drive transistor is electrically connected to the anode of the light emitting element.

5. The display panel according to claim 3, wherein the first transistor is multiplexed as the reset transistor, and the first reference voltage signal terminal is multiplexed as the reset signal terminal.

6. The display panel according to claim 4, wherein:
the pixel circuit further comprises a data writing module and a light emitting control module;
the light emitting control module is electrically connected to a first voltage signal terminal and the anode of the light emitting element respectively;
a cathode of the light emitting element is electrically connected to a second power signal terminal; and
the drive transistor is electrically connected to the lighting control module and the data writing module respectively.

7. The display panel according to claim 6, further comprising a second transistor, wherein:
a first electrode of the second transistor is connected to the first reference voltage signal terminal, and a second electrode of the second transistor is connected to a gate of the drive transistor.

8. The display panel according to claim 6, further comprising a third transistor, wherein:
a first electrode of the third transistor is connected to a second reference voltage signal terminal, a second electrode of the third transistor is connected to the gate of the drive transistor; and
a potential connected to the second reference voltage signal terminal is different from a potential connected to the first reference voltage signal terminal.

9. The display panel according to claim 8, wherein a potential connected to the second reference voltage signal terminal is greater than a potential connected to the first reference voltage signal terminal.

10. The display panel according to claim 6, wherein:
the data writing module comprises a first data writing transistor and a second data writing transistor, a first electrode of the first data writing transistor is connected to a data voltage signal terminal, a second electrode of the first data writing transistor is connected to a first electrode of the drive transistor, a first electrode of the second data writing transistor is connected to the gate of the drive transistor, and a second electrode of the second data writing transistor is connected to a second electrode of the drive transistor;
the light emitting control module comprises a first light emitting control transistor and a second light emitting control transistor, a first electrode of the first light emitting control transistor is connected to the first voltage signal terminal, a second electrode of the first light emitting control transistor is connected to the first electrode of the drive transistor, a first electrode of the second light emitting control transistor is connected to the second electrode of the drive transistor, and a second electrode of the second light emitting control transistor is connected to the anode of the light emitting element; and
the display panel further comprises a storage capacitor, one end of the storage capacitor is connected to the first voltage signal terminal, and another end of the storage capacitor is connected to the gate of the drive transistor.

11. The display panel according to claim 10, wherein the second electrode of the first transistor is connected to the second electrode of the drive transistor, and the second electrode of the first transistor is connected to a first electrode of the second light emitting control transistor.

12. The display panel according to claim 1, wherein the first transistor is a P-type transistor, the first transistor comprises a first active part, and the first active part comprises a silicon semiconductor.

13. The display panel according to claim 12, wherein:
the first transistor further includes a first gate, a first source, and a first drain;
along a first direction, a length of the channel region of the first transistor is L, along a second direction, a width of the channel region of the first transistor is W, and a width-to-length ratio of the channel region of the first transistor is W/L; and
in a direction parallel to a light emitting surface of the display panel, a direction of the first source pointing to the first drain is the first direction, and the second direction intersects the first direction.

14. The display panel according to claim 13, wherein:
a width of the channel region of the first transistor in the first subpixel is W1, and a width of the channel region of the first transistor in the second subpixel is W2;
a length of the channel region of the first transistor in the first subpixel is L1, and a length of the channel region of the first transistor in the second subpixel is L2;

if W1=W2,L1<L2; or if L1=L2,W1>W2.

15. The display panel according to claim 13, wherein:
along the first direction, in the first subpixel, a length of the first gate of the first transistor is A1, and in the second subpixel, a length of the first gate of the first transistor is A2;
along the second direction, in the first subpixel, a length of the first active part of the first transistor is B1, and in the second subpixel, a length of the first active part of the first transistor is B2;

if A1=A2,B1>B2; or if B1=B2,A1<A2.

16. The display panel according to claim 13, wherein:
the first gate comprises a first subsection and a second subsection, in a direction perpendicular to a light emitting surface of the display panel, the first subsection overlaps the first active part, and the second subsection does not overlap the first active part;
along the first direction, in the first subpixel, a length of the first subsection of the first gate of the first transistor is C1, a length of the second subsection of the first gate of the first transistor is C2, and in the second subpixel, a length of the first subsection of the first gate of the first transistor is C3, and a length of the second subsection of the first gate of the first transistor is C4;
along the second direction, in the first subpixel, a length of the first active part of the first transistor is D1, and in the second subpixel, a length of the first active part of the first transistor is D2; and if D1=D2 and C2=C4,C1<C3.

17. The display panel according to claim 13, wherein:
the first active part includes a third subsection and a fourth subsection, and in a direction perpendicular to the light emitting surface of the display panel, the third subsection overlaps the first gate, and the fourth subsection does not overlap the first gate;

along the second direction, in the first subpixel, a length of the third subsection of the first active part of the first transistor is E1, a length of the fourth subsection of the first active part of the first transistor is E2, and in the second subpixel, a length of the third subsection of the first active part of the first transistor is E3, and a length of the fourth subsection of the first active part of the first transistor is E4;

along the first direction, in the first subpixel, a length of the first gate of the first transistor is F1, in the second subpixel, a length of the first gate of the first transistor is F2; and if F1=F2 and E2=E4, E1>E3.

18. The display panel according to claim 13, wherein the length L of the channel region of the first transistor is less than or equal to 3.5 μm, and the width W of the channel region of the first transistor is less than or equal to 3 μm.

19. The display panel according to claim 1, wherein:
the first subpixel comprises a first via hole and at least one second via hole, in a direction parallel to a light emitting surface of the display panel, a distance from the first via hole to the channel region of the first transistor in the first subpixel is smaller than a distance from the second via hole to the channel region of the first transistor in the first subpixel, and the distance from the first via hole to the channel region of the first transistor in the first subpixel is K1;

a second subpixel comprises a third via hole and at least one fourth via hole, and in a direction parallel to a light emitting surface of the display panel, a distance from the third via hole to the channel region of the first transistor in the second subpixel is smaller than a distance from the fourth via hole to the channel region of the first transistor in the second subpixel, the distance from the third via hole to the channel region of the first transistor in the second subpixel is K2; and

K1<K2.

20. The display panel according to claim 1, wherein:
the light emitting element in the first subpixel is any one of a red light emitting element and a green light emitting element, and the light emitting element in the second subpixel is a blue light emitting element; or the light emitting element in the first subpixel is a red light emitting element, and the light emitting element in the second subpixel is a green light emitting element.

21. A display device, comprising a display panel comprising a plurality of subpixels, wherein:
a subpixel of the plurality of subpixels comprises a pixel circuit and a light emitting element that are electrically connected, the pixel circuit comprises a first transistor, a first electrode of the first transistor is connected to a first reference voltage signal terminal, and a second electrode of the first transistor is electrically connected to an anode of the light emitting element;

in a light emitting retention stage of the subpixel of the plurality of subpixels, the first reference voltage signal terminal is connected to a negative potential signal or a ground potential signal;

the plurality of subpixels comprises at least a first subpixel and a second subpixel, and a color of the first subpixel is different from a color of the second subpixel; and a width-to-length ratio of a channel region of the first transistor in the first subpixel is N1, a width-to-length ratio of a channel region of the first transistor in the second subpixel is N2, and N1>N2.

* * * * *